(12) United States Patent
Ko et al.

(10) Patent No.: US 10,373,791 B2
(45) Date of Patent: Aug. 6, 2019

(54) SWITCH MATRIX ASSEMBLY AND MAGNETIC RESONANCE IMAGING APPARATUS USING THE SAME

(71) Applicant: Samsung Electronics Co., Ltd., Suwon-si (KR)

(72) Inventors: Yun-Kyoung Ko, Suwon-si (KR); Han Lim Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 209 days.

(21) Appl. No.: 15/228,550

(22) Filed: Aug. 4, 2016

(65) Prior Publication Data

US 2017/0069453 A1    Mar. 9, 2017

(30) Foreign Application Priority Data

Sep. 7, 2015   (KR) .................. 10-2015-0126313

(51) Int. Cl.
*H03K 17/00* (2006.01)
*H01H 67/24* (2006.01)
*G01R 33/36* (2006.01)

(52) U.S. Cl.
CPC ............. *H01H 67/24* (2013.01); *G01R 33/36* (2013.01); *G01R 33/3664* (2013.01)

(58) Field of Classification Search
CPC ...... H01H 67/24; G01R 33/36; H03K 17/693; H03K 17/005; H03K 17/74; H03K 17/6257; H04J 3/047
USPC ....................................................... 307/115
See application file for complete search history.

(56) References Cited

U.S. PATENT DOCUMENTS

| 6,813,274 | B1 * | 11/2004 | Suzuki .................. H04L 49/101 370/386 |
| 8,035,389 | B2 | 10/2011 | Xing et al. |
| 2003/0041208 | A1 * | 2/2003 | Volkmar ............... H04L 49/552 710/316 |
| 2005/0259491 | A1 | 11/2005 | Yarbrough, III et al. |
| 2007/0280261 | A1 * | 12/2007 | Szymanski ......... H04L 12/5601 370/395.4 |
| 2009/0174498 | A1 | 7/2009 | Xing et al. |
| 2009/0201822 | A1 * | 8/2009 | Goeke .................. H03K 17/002 370/250 |

(Continued)

FOREIGN PATENT DOCUMENTS

| DE | 10 2004 031 149 A1 | 9/2005 |
| JP | 2013-505044 | 2/2013 |

OTHER PUBLICATIONS

Korean Office Action dated Nov. 17, 2017 in corresponding Korean Patent Application No. 10-2015-0126313, 15 pages.

(Continued)

*Primary Examiner* — Anh Q Tra
(74) *Attorney, Agent, or Firm* — Staas & Halsey LLP

(57) ABSTRACT

A switch matrix, a switch matrix assembly, and a magnetic resonance imaging (MRI) apparatus are disclosed. The switch matrix includes a first path to which an electric signal is applied; a first switching unit configured to selectively and electrically interconnect a first input unit and a first end of the first path or to open the first end of the first path; and a second switching unit configured to selectively and electrically connect a second input unit to a second end of the first path or to open the second end of the first path.

20 Claims, 34 Drawing Sheets

(56) References Cited

U.S. PATENT DOCUMENTS

2013/0329748 A1 12/2013 Szymanski
2015/0123697 A1* 5/2015 Blair ................ G01R 31/3004
324/762.02

OTHER PUBLICATIONS

Extended European Search Report dated Aug. 4, 2017 in corresponding European Patent Application No. 16183176.3.
Lee H L: "Reconfigurable multi-channel RF crossbar switch matrix for MRI receiver front-end," Electronics Letters, vol. 53, No. 6, Mar. 16, 2017, pp. 380-381, XP006060426.
Decision on Grant Notice of Allowance dated May 21, 2018 in corresponding Korean Patent Application No. 10-2015-0126313 (5 pages).

* cited by examiner

SWITCH MATRIX ASSEMBLY AND MAGNETIC RESONANCE IMAGING APPARATUS USING THE SAME

CROSS-REFERENCE TO RELATED APPLICATIONS

This application claims the benefit of Korean Patent Application No. 10-2015-0126313, filed on Sep. 7, 2015 in the Korean Intellectual Property Office, the disclosure of which is incorporated herein by reference.

BACKGROUND

1. Field

Embodiments of the present invention relate to a switch matrix assembly and a magnetic resonance imaging (MRI) apparatus using the same.

2. Description of the Related Art

In recent times, various electronic appliances have been designed to transmit acquired electric signals either to other devices in various directions or to constituent components embedded therein. In order to transmit such electric signals, a conductive line formed of copper (Cu), aluminum (Al) or an alloy, or a printed circuit board (PCB) may be used for the electronic appliances. Conductive lines or circuits may be arranged in a predetermined pattern. The conductive lines or circuits may be arranged in a matrix form, such that input electric signals can be transmitted to specific components using the conductive lines or circuits. A representative example of the matrix-shaped conductive lines or circuits is a crossbar switch matrix.

An imaging apparatus acquires an image of an external or internal part of an object using visible light, infrared light, ultrasound, radiation, or Nuclear Magnetic Resonance (NMR), and provides the acquired image to a user. Examples of the imaging apparatus may include a camera, an infrared camera, an ultrasonic imaging apparatus, a digital radiation imaging apparatus, a computed tomography (CT) apparatus, a mammography apparatus, or a magnetic resonance imaging (MRI) apparatus, etc. Various conductive lines or circuits may be used to transmit electric signals in the above-mentioned imaging apparatuses, for example, the above-mentioned crossbar switch matrix may be used.

The magnetic resonance imaging (MRI) apparatus captures a cross-sectional image of an internal part of an object such as a human, an animal or a plant using the phenomenon of nuclear magnetic resonance (NMR). The MRI apparatus may acquire a magnetic resonance image based on a free induction decay (FID) signal acquired when a magnetization vector of a nucleus exposed to a magnetic field induces a signal in a neighboring radio frequency (RF) coil.

SUMMARY

Various embodiments of the present invention are directed to providing a switch matrix assembly and a magnetic resonance imaging (MRI) apparatus that substantially obviates one or more problems due to limitations and disadvantages of the related art.

Therefore, it is an aspect of the present invention to provide a switch matrix assembly configured to solve signal insertion loss caused by open-stub capacitance generated from a signal path located after each switch of a crossbar switch matrix in which several signal paths are formed to cross each other and a switch is located at an intersection point, and a magnetic resonance imaging (MRI) apparatus using the same.

It is another aspect of the present invention to provide a switch matrix assembly in which a relatively small matrix can be designed even when input and output values of the crossbar switch matrix are increased such that production costs can be greatly reduced, and a magnetic resonance imaging (MRI) apparatus using the same.

It is another aspect of the present invention to provide a switch matrix assembly configured to directly transmit a high-frequency radio frequency (RF) signal without reducing the high-frequency RF signal to an intermediate frequency (IF) band, and a magnetic resonance imaging (MRI) apparatus using the same.

It is another aspect of the present invention to provide a switch matrix assembly configured to transmit an input high-frequency radio frequency (RF) signal without using an additional device even when the high-frequency signal is in a high frequency band, irrespective of a frequency band of the input high-frequency RF signal, and a magnetic resonance imaging (MRI) apparatus using the same.

Additional aspects of the invention will be set forth in part in the description which follows and, in part, will be obvious from the description, or may be learned by practice of the invention.

In accordance with an aspect of the present invention, a switch matrix assembly includes: a switch matrix having a first path through which an electric signal corresponding to a free induction decay (FID) signal is received and the electric signal is transmitted; a first switching unit configured to selectively and electrically one of interconnect a first input unit and a first end of the first path, and to open a first end of the first path; and a second switching unit configured to selectively and electrically one of interconnect a second input unit and a second end of the first path, and to open a second end of the first path.

The first switching unit may open the first end of the first path when the second switching unit electrically interconnects the second input unit and the second end of the first path.

The switch matrix assembly may further include: a first inductor connected to the first switching unit, wherein the first switching unit selectively connects the first end of the first path to the first inductor.

When the second switching unit electrically interconnects the second input unit and the second end of the first path, the first switching unit may selectively one of open the first end of the first path or may connect the first end of the first path to the first inductor.

At a time the second switching unit electrically interconnects the second input unit and the second end of the first path, when a capacitance occurs due to an open-stub, the first switching unit connects the first end of the first path to the inductor; and when a capacitance does not occur due to the open-stub, the first switching unit opens the first end of the first path.

The switch matrix may further include: at least one second path arranged to cross the first path, and to include an output unit at one end thereof; and at least one path switching unit disposed at an intersection of the first path and the second path, configured to electrically one of interconnect and disconnect the first path and the second path.

At a time any one first path switching unit from among path switching unit is located adjacent to the second switching unit, the first switching unit may connect the first end of the first path to the inductor.

At a time any one first path switching unit from among path switching unit is located adjacent to the first switching unit, the first switching unit may open the first end of the first path.

The first inductor may include a plurality of inductors having different inductances; and the first switching unit may connect any one of the plurality of inductors to the first end of the first path.

The first switching unit may connect any one of the plurality of inductors to the first end of the first path according to an open-stub capacitance.

The switch matrix assembly may further include: a first resistor connected to the first switching unit, wherein the first switching unit further connects the first end of the first path to the first resistor.

The first switching unit may connect the first end of the first path to the first resistor when the electric signal applied to the first path is not used.

The first switching unit may further include an inductor connection unit connected to a first inductor; and any one of the input unit connection unit, the opening unit, and the inductor connection unit is selectively connected to the matrix connection unit.

The first switching unit may further include a plurality of inductor connection units respectively connected to a plurality of inductors; and any one of the input unit, the opening unit, and the plurality of inductor connection units is selectively connected to the matrix connection unit.

The first switching unit may further include a resistor connection unit connected to a first resistor; and any one of the input unit connection unit, the opening unit, and the resistor connection unit may be selectively connected to the matrix connection unit.

The second switching unit may open the second end of the first path when the first switching unit electrically connects the first input unit to the first end of the first path.

The switch matrix assembly may further include: a second inductor connected to the second switching unit, wherein the second switching unit further selectively connects the second end of the first path to the second inductor.

The switch matrix assembly may further include: a second resistor connected to the second switching unit, wherein the second switching unit may further connect the second end of the first path to the second resistor.

In accordance with another aspect of the present invention, a switch matrix assembly includes: a matrix switching unit configured to receive at least one electric signal from the first input unit and a second input unit; a first switch matrix configured to include a first path to which the electric signal is applied; a first switching unit configured to electrically one of interconnect and disconnect the matrix switching unit and a first end of the first path; a second matrix switch configured to include a second path to which the electric signal is applied; and a second switching unit configured to electrically one of interconnect the matrix switching unit and a first end of the second path and to open a second end of the second path, wherein the matrix switching unit selectively one of interconnects the first input unit and the first switching unit and interconnects the second input unit and the first switching unit.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION

Figure 1:
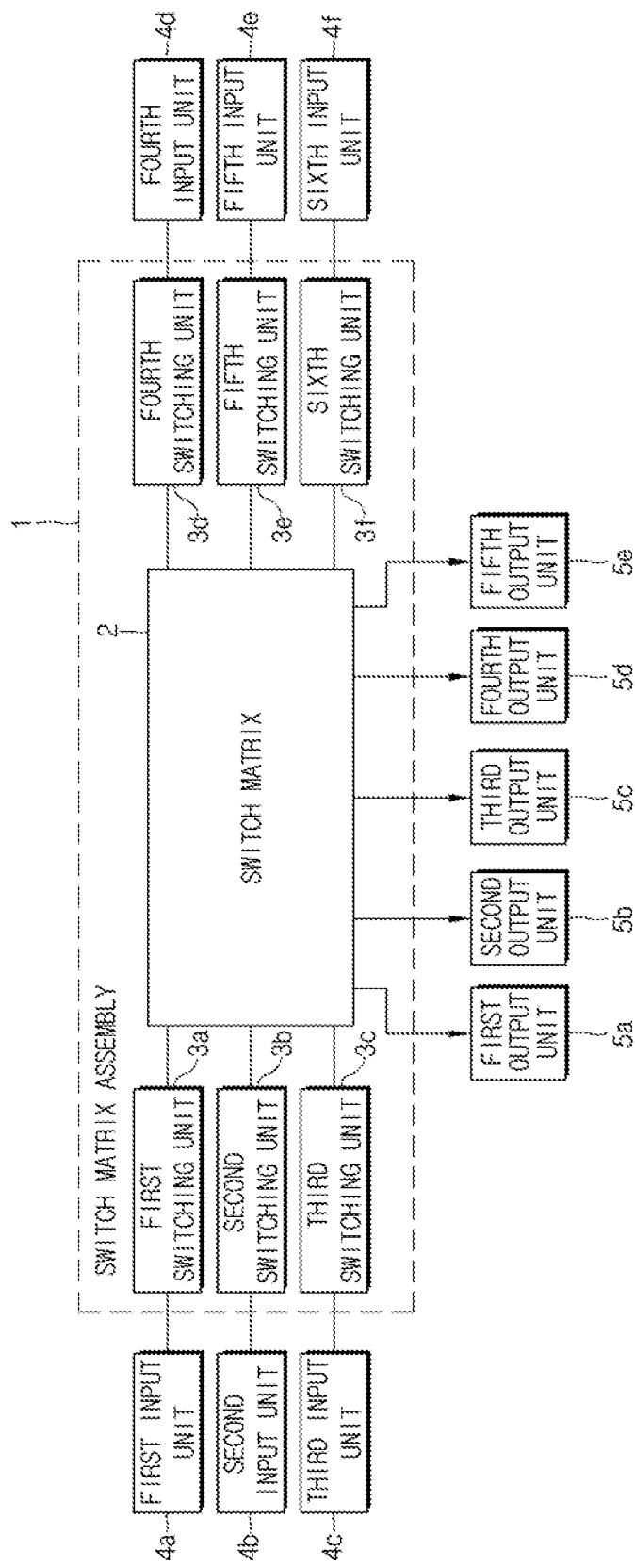
FIG. 1 is a block diagram illustrating a switch matrix according to an embodiment of the present invention.

Reference will now be made in detail to the embodiments of the present invention, examples of which are illustrated in the accompanying drawings, wherein like reference numerals refer to like elements throughout.

Various examples of the switch matrix assembly according to various embodiments of the present invention will hereinafter be described with reference to FIGS. 1 to 28.

FIG. 1 is a block diagram illustrating a switch matrix according to an embodiment of the present invention.

Referring to FIG. 1, a switch matrix assembly 1 may include a switch matrix 2, a plurality of switching units (3a to 3f) connected to the switch matrix 2, and a plurality of output units (5a to 5e) configured to respectively output electric signals.

The switch matrix 2 may receive at least one signal from an external part through the plurality of switching units (3a to 3f), and may output the received signal to the external part through at least one output unit (5a to 5e).

In more detail, the switch matrix 2 may receive or may not receive electric signals acquired from a plurality of input units (4a to 4f) according to the operation of respective switching units (4a to 4f). In more detail, the switch matrix 2 may receive or may not receive electric signals according to the on/off operations of the plurality of switching units (3a to 3f) corresponding to the plurality of input units (4a to 4f).

In accordance with the embodiment, the switch matrix 2 may receive only the electric signal through only one path at a time, or may receive the electric signal through a plurality of paths at a time. In other words, the switch matrix 2 may receive the electric signal only through any one of the switching units (3a to 3f) at a specific time, or may receive a plurality of electric signals using at least two of the switching units (3a to 3f) at a specific time. In this case, the switch matrix 2 may receive the electric signals from the corresponding switching units (for example, the first to fourth switching units 3a to 3d) at different times. In other words, if the switch matrix 2 receives an electric signal from the first switching unit 3a, the switch matrix 2 may not receive the electric signal from the fourth switching unit 3d arranged to correspond to the first switching unit 3a.

Upon receiving the electric signal, the switch matrix 2 may output the input electric signal to the desired output unit (5a, 5b, 5c, 5d, or 5e). Therefore, the switch matrix 2 can construct a proper path in such a manner that the electric signal acquired from the input units (4a to 4f) can be properly selected by a processor connected to at least one output unit (5a to 5e) or the like.

The at least one output unit (5a to 5e) may output the electric signal passing through the switch matrix 2.

The plurality of switching units (3a to 3f) may be connected to the switch matrix 2. The switching units (3a to 3f) may electrically connect or disconnect the input units (4a to 4f) to or from the switch matrix 2, respectively. Therefore, the electric signal acquired from at least one input unit (4a to 4f) may be input to or may not be input to the switch matrix 2.

At least two switching units (3a and 3d, 3b and 3e, or 3c and 3f) from among the plurality of switching units (3a~3f) may be arranged to correspond to each other. For example, at least two switching units (3a and 3d, 3b and 3e, or 3c and 3f) corresponding to each other may be arranged to face each other on the basis of the switch matrix 2. In this case, at least two switching units (3a and 3d, 3b and 3e, or 3c and 3f) may be disposed at both ends of a single first path (see 11 to 19 of FIG. 2). Therefore, the electric signals respectively input to at least two switching units (3a and 3d, 3b and 3e, or 3c and 3f) may be transmitted through the same first path (11 to 19).

The first to sixth input units (4a to 4f) may receive a predetermined electric signal from the external part and then output the received electric signal, or may generate an electric signal corresponding to the phenomenon generated from the external part and then output the generated electric signal. The first to sixth input units (4a to 4f) may be respectively connected to the first to sixth switching units (3a to 3f), and may transmit the electric signals to the switch matrix 2 according to the opening or closing (or ON or OFF action) of the first to sixth switching units (3a to 3f).

The first to sixth input units (4a to 4f) may be implemented as wired cable ports (e.g., sockets, plugs, or the like) connectable to wired cable terminals. The first to sixth input units (4a to 4f) may be wireless communication modules configured to collect signals received through a wireless communication network, or may be RF coils configured to acquire the free induction decay (FID) signal generated by the magnetic resonance phenomenon of the magnetic resonance imaging (MRI) apparatus. In addition, the first to six input units (4a to 4f) may be used as various units for collecting or receiving various types of signals.

The first to sixth input units (4a to 4f) may be used as the same devices capable of receiving homogeneous electric signals. Alternatively, all or some of the first to sixth input units (4a to 4f) may be different devices capable of receiving different electric signals. For example, all the first to sixth input units (4a to 4f) may be wired cable ports, and some of the first to sixth input units (4a to 4f) may be wired cable ports and the remaining input units may be wireless communication modules.

The switch matrix 2 will hereinafter be described in detail.

Figure 2:
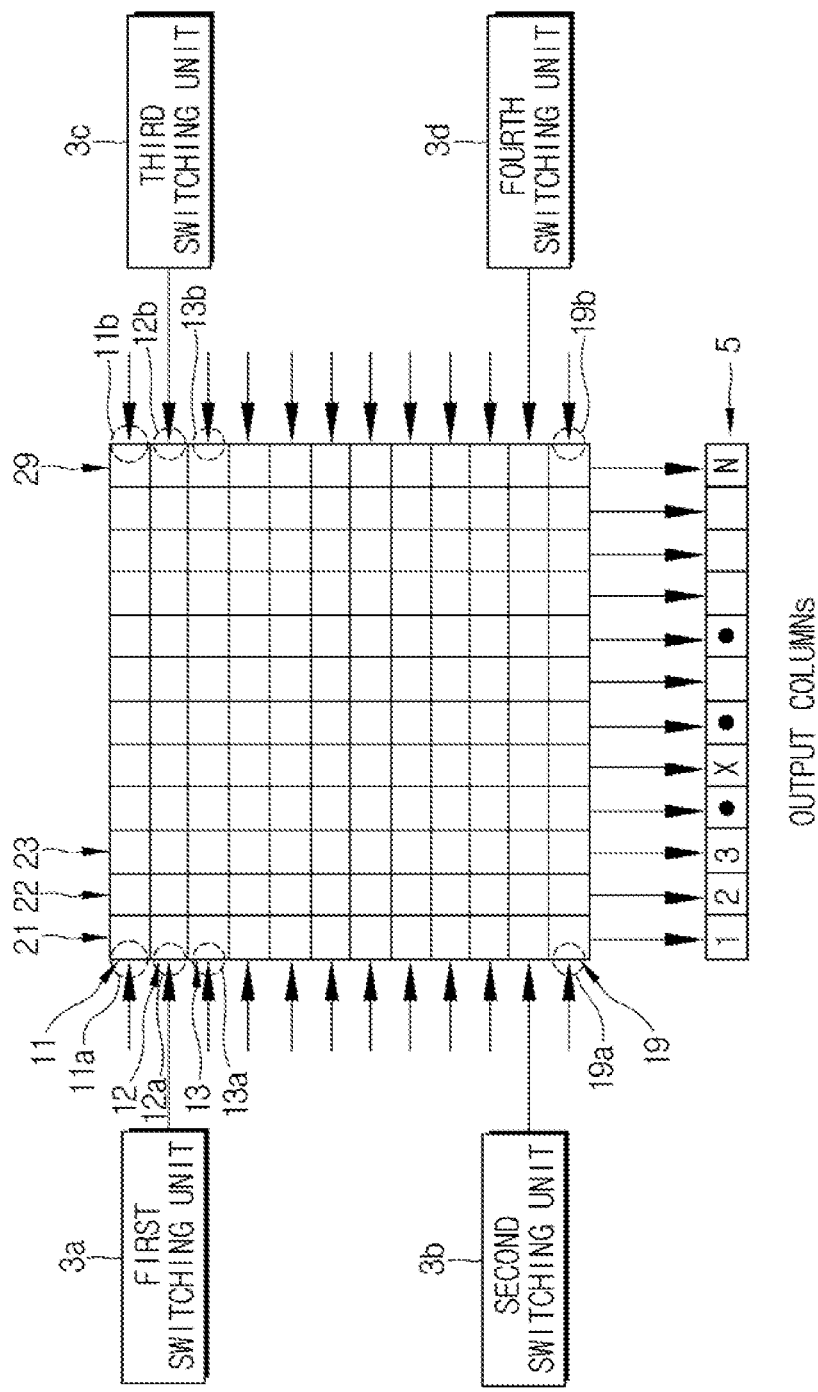
FIG. 2 is a detailed schematic diagram illustrating a switch matrix according to an embodiment of the present invention.
Figure 3:
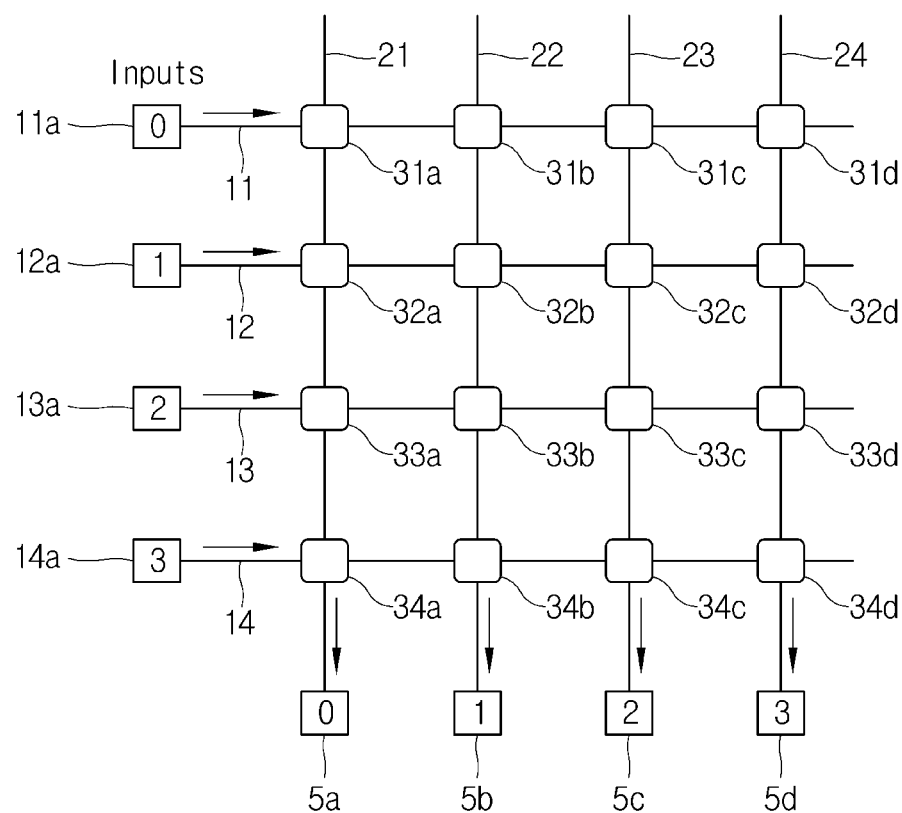
FIG. 3 is a schematic diagram illustrating a switch matrix structure according to an embodiment of the present invention.
Figure 4:
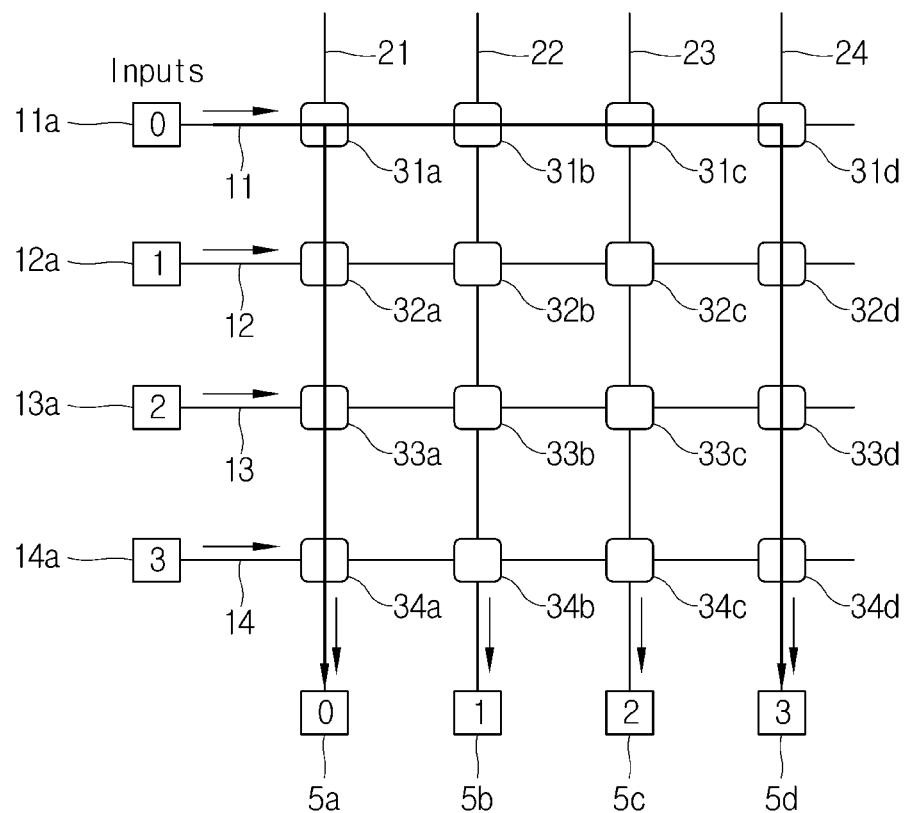
FIG. 4 is a conceptual diagram illustrating a progressing direction of an electric signal when a path switching unit is turned on or off according to one embodiment of the present invention.
Figure 5:
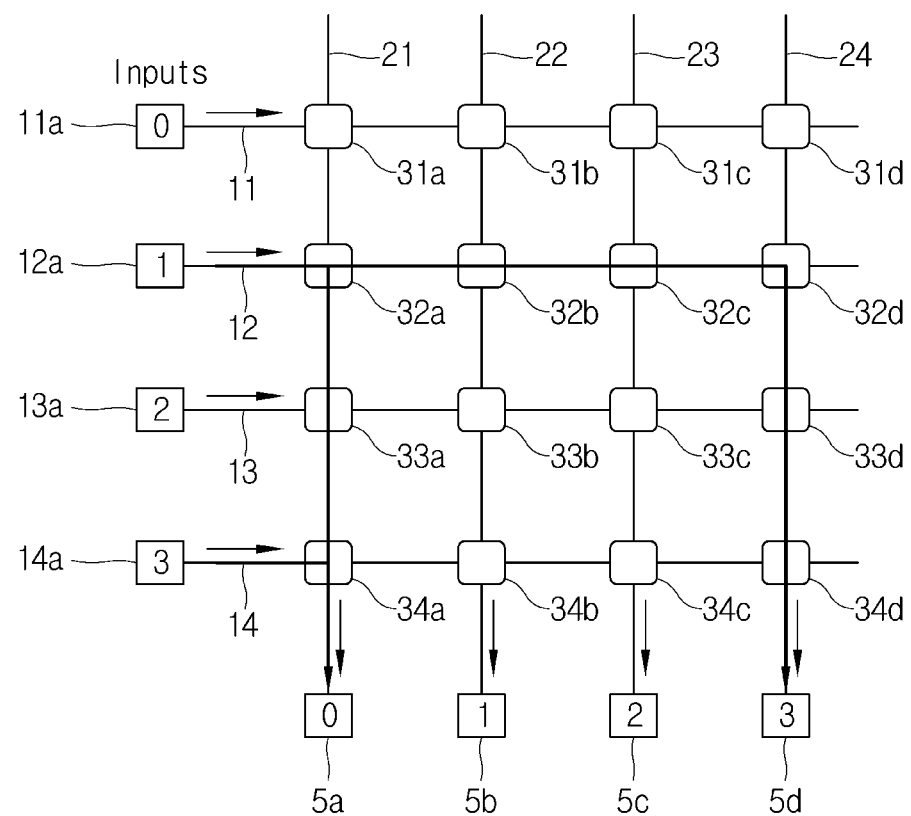
FIG. 5 is a conceptual diagram illustrating a progressing direction of an electric signal when a path switching unit is turned on or off according to another embodiment of the present invention.
Figure 6:
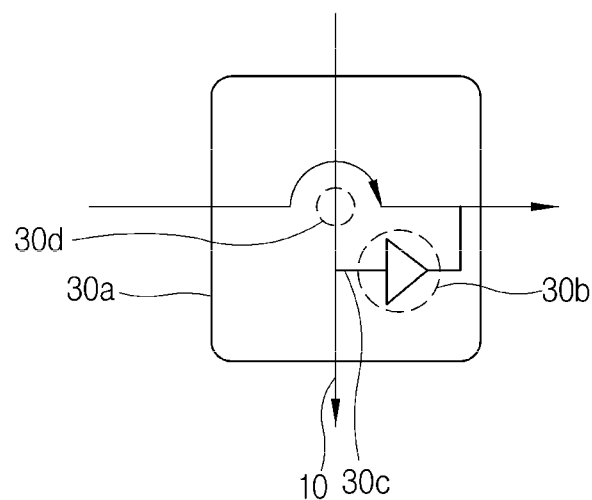
FIG. 6 is a conceptual diagram illustrating a path switching unit of a switch matrix according to an embodiment of the present invention.

FIG. 2 is a detailed schematic diagram illustrating a switch matrix according to an embodiment of the present invention. FIG. 3 is a schematic diagram illustrating the switch matrix structure according to an embodiment of the present invention. FIG. 4 is a conceptual diagram illustrating a progressing direction of an electric signal when a path switching unit is turned on or off according to one embodiment of the present invention. FIG. 5 is a conceptual diagram illustrating a progressing direction of an electric signal when a path switching unit is turned on or off according to another embodiment of the present invention. FIG. 6 is a conceptual diagram illustrating a path switching unit of a switch matrix according to an embodiment of the present invention.

The switch matrix 2 may include a plurality of signal paths (10, 20) through which electric signals can be transmitted; and at least one path switching unit (31a to 31d, 32a to 32d, 33a to 33d, 34a to 34d). The signal paths (10, 20) may be arranged to cross each other at one or more points. For convenience of description, a signal path horizontally extended as shown in FIGS. 2 to 6 will hereinafter be referred to as a first path (11 to 19), and a signal path vertically extended as shown in FIGS. 2 to 6 will hereinafter be referred to as a second path (21 to 29).

At least one first path (11 to 19) may be arranged to transmit the electric signal, and may be implemented as, for example, a conductive metal line or the like. The first path (11 to 19) may also be implemented as a printed circuit board (PCB).

The switch matrix 2 may include M first paths (11 to 19), where M is a natural number of 1 or higher. M first paths (11 to 19) may be spaced apart from one another by a predetermined distance, and may also be arranged parallel to each other as necessary. However, the M first paths (11 to 19) are not always parallel to one another, and may also be spaced apart from one another by a predetermined distance in such a manner that there is no electric interference or no electric connection between the M first paths (11 to 19) as necessary. The first path (11 to 19) may extend in a predetermined direction, and both ends of the first path (11 to 19) may construct two ends of the switch matrix 2.

A plurality of matrix input units (11a to 19a, 11b to 19b) may be formed in the first path (11 to 19), and the matrix input units (11a to 19a, 11b to 19b) may be respectively connected to the corresponding switching units (3a to 3f).

In accordance with the embodiment, the matrix input units (11a to 19a, 11b to 19b) may be respectively formed at the end of the first path (11 to 19). In this case, some of the matrix input units (11a to 19a, 11b to 19b) may be formed at one end (hereinafter referred to as a first end) of the first path (11 to 19), and the remaining matrix input units may be formed at the other end (hereinafter referred to as a second end) of the first path (11 to 19).

In other words, the matrix input units (11a to 19a and 11b to 19b) may be respectively arranged at both ends of the first path (11 to 19). Therefore, at least two matrix input units (11a and 11b, 12a and 12b, 13a and 13b, 19a and 19b) from among the plurality of matrix input units (11a to 19a, 11b to 19b) may share one first path (11 to 19), such that the at least two matrix input units may be arranged to correspond to each other.

In more detail, the first matrix input unit 11a from among the plurality of matrix input units (11a to 19a) may correspond to the first (M+1)-th matrix input unit 11b, and the second matrix input unit 12a may correspond to the (M+2)-th matrix input unit 12b. Likewise, the M-th matrix input unit may correspond to the 2M-th matrix input unit. That is, the k-th matrix input unit may correspond to the (M+k)-th matrix input unit, where k is a natural number selected from 1 to M.

Therefore, assuming that M first paths (11 to 19) are provided to one switch matrix 2, 2M matrix input units (11a to 19a, 11b to 19b) corresponding to two times the number (M) of first paths (11 to 19) may be provided to the single switch matrix 2.

In the meantime, assuming that both ends of the first path (11 to 19) construct both ends of the switch matrix 2, the 2M matrix input units (11a to 19a, 11b to 19b) may be arranged to face each other at both ends of the switch matrix 2.

In this case, the M matrix input units from among the 2M matrix input units (11a to 19a, 11b to 19b) may be arranged at one end of the switch matrix 2, and the other P matrix input units may be arranged at the other end located at the opposite side of one end where the P matrix input units are arranged. In more detail, the (M+1)-th matrix input unit may be located at the opposite side of one end where the first matrix input unit is disposed within the switch matrix 2, and the 2P matrix input units may be located opposite to one end at which the P matrix input units are arranged. In other words, the k-th matrix input unit and the (P+k)-th matrix input unit may be arranged to face each other on the basis of the switch matrix 2. Assuming that the matrix input units (11a to 19a, 11b to 19b) are arranged, the same number of matrix input units (11a to 19a, 11b to 19b) may be disposed at both ends of the switch matrix 2.

In accordance with the embodiment, the matrix input units (11a to 19a, 11b to 19b) may not be arranged at the end of some paths from among the plurality of first paths (11 to 19). In this case, a total number of the matrix input units (11a to 19a, 11b to 19b) may be less than 2M corresponding to two times the number (M) of the first paths (11 to 19).

The switching units (3a to 3f) may be installed at the respective matrix input units (11a to 19a, 11b to 19b). In accordance with the embodiment, the switching units (3a to 3f) may not be installed in at least one matrix input unit from among the matrix input units (11a to 19a, 11b to 19b). The respective matrix input units (11a to 19a, 11b to 19b) may be coupled to the input units, for example, the first to sixth input units (4a to 4f), according to the operation of the switching units (3a to 3f), or may not be coupled to the input units (4a to 4f) as necessary. In addition, according to the embodiment, the respective matrix input units (11a to 19a, 11b to 19b) may be coupled to the inductor or resistor according to the operation of the switching units (3a to 3f). A detailed description thereof will hereinafter be given.

The respective matrix input units (11a to 19a, 11b to 19b) may be implemented using the end part of the first path (11 to 19). In other words, the end part of the path may function as the matrix input units (11a to 19a, 11b to 19b) without using additional components. In more detail, the matrix input units (11a to 19a, 11b to 19b) may be implemented using a first end or a second end of the first path (11 to 19). In this case, the first to P-th matrix input units (11a to 19a) may be implemented using the first end of the first path (11 to 19), and the (P+1)-th to 2P-th matrix input units (11b to 19b) may be implemented using the second end of the first path (11 to 19).

In addition, the respective matrix input units (11a to 19a, 11b to 19b) may also be implemented using various connection units capable of interconnecting circuits (e.g., a separate port or terminal), interconnecting a circuit and a cable, or interconnecting a cable and a cable.

At least one second path (21 to 29) may be arranged to transmit the electric signal. For example, at least one second path (21 to 29) may be implemented using a conductive metal line, a printed circuit board, or the like.

The second path (21 to 29) may extended in a different direction from the direction formed by extending the first path (11 to 29). In this case, the second path (21 to 29) may also be orthogonal to the first path (11 to 29).

The at least one second path (21 to 29) may be perpendicular to the at least one first path (11 to 19). In this case, one second path (any one of the second paths 21 to 29) may be arranged perpendicular to the plurality of first paths (11 to 19), and the plurality of second paths (21 to 29) may also be arranged perpendicular to any one of the first paths (11 to 19).

At least one path switching unit (31a to 31d, 32a to 32d, 33a to 33d, 34a to 34d) may be arranged at an intersection of the first path (11 to 19) and the second path (21 to 29). At least one second path 21 to 29) may be interconnected through at least one path switching unit (31a to 31d, 32a to 32d, 33a to 33d, 34a to 34d) disposed between at least one second path (21 to 29) and at least one first path (11 to 19), or may be disconnected.

The switch matrix 2 may include N second paths (21 to 29), where N is a natural number of 1 or higher. N second paths (21 to 29) may be spaced apart from each other by a predetermined distance, and may be arranged parallel to each other. However, N second paths (21 to 29) are not always parallel to each other. If necessary, N second paths (21 to 29) may not cause electrical interference therebetween, or may be spaced apart from each other by a predetermined distance without causing electric connection therebetween.

The number (N) of the second paths (21 to 29) may be identical to the number (M) of the first paths (11 to 19), where M=N. In addition, the number (N) of second paths (21 to 29) may be different from the number (M) of first paths (11 to 19). The number (N) of second paths (21 to 29) may be higher than the number (M) of first paths (11 to 19) (where M<N), and may be less than the number (M) of first paths (11 to 19) (where M>N). At least one output unit (5a to 5e) may be formed at one end of the second path (21 to 29). The other end of the second path (21 to 29) may be grounded or disconnected.

At least one path switching unit (31a to 31d, 32a to 32d, 33a to 33d, 34a to 34d) may be provided at the insertion point of the first path (11 to 19) and the second path (21 to 29) as shown in FIG. 3. The first path (11 to 19) and the second path (21 to 29) may be interconnected or disconnected. In this case, at least one path switching unit (31a to 31d, 32a to 32d, 33a to 33d, 34a to 34d) may interconnect the first path (11 to 19) and the second path (21 to 29), and this interconnection state is referred to as an ON state. At least one path switching unit (31a to 31d, 32a to 32d, 33a to 33d, 34a to 34d) may disconnect the first path (11 to 19) and the second path (21 to 29) from each other, and this disconnection state is referred to as an OFF state.

In more detail, the $11^{th}$ path 11 from among the first paths may cross the plurality of second paths, for example, the $21^{st}$ to $24^{th}$ paths (21 to 24), at various intersection points, and one path switching unit (31a to 31d) may be installed at each intersection point. The path switching unit installed at each intersection point, for example, the first path switching unit 31a, may electrically interconnect the paths (e.g., the $11^{th}$ path 11a and the $21^{st}$ path 11b) arranged to cross at the intersection point, or may electrically disconnect the paths (e.g., the $11^{th}$ path 11a and the $21^{st}$ path 11b). Likewise, the path switching units (31b to 31d) disposed at the $11^{th}$ path 11a may electrically interconnect the $11^{th}$ path 11a and the $22^{nd}$ to $24^{th}$ paths (22 to 24) or may disconnect the $11^{th}$ path 11a and the $22^{nd}$ to $24^{th}$ paths (22 to 24) from each other.

For example, as shown in FIG. 4, assuming that the first path switching unit 31a is turned on such that the $11^{th}$ path 11 is connected to the $21^{st}$ path 21, the electric signal received from the first matrix input unit 11a disposed at the first end of the $11^{th}$ path 11 may move to the first output unit 5a through the $11^{th}$ path 11, the first path switching unit 31a, and the $21^{st}$ path 21. In addition, assuming that the second path switching unit 31d is turned on such that the $11^{th}$ path 11 is connected to the $24^{th}$ path 24, the electric signal received from the first matrix input unit 11a disposed at the first end of the $11^{th}$ path 11 may move to the fourth output unit 5d through the $11^{th}$ path 11, the second path switching unit 31a, and the $24^{th}$ path 24. Therefore, the signal received through the same matrix input unit 11a may be output through different output units (i.e., the first output unit 5a and the fifth output unit 5d.)

In addition, as shown in FIG. 5, assuming that the third path switching unit 32a is turned on such that the $12^{th}$ path 12 is connected to the $21^{st}$ path 21, the electric signal received from the second matrix input unit 12a disposed at the first end of the $12^{th}$ path 12 may move to the first output unit 5a through the $12^{th}$ path 12, the third path switching unit 32a, and the $21^{st}$ path 21. In addition, assuming that the fourth path switching unit 34a is turned on such that the $14^{th}$ path 14 is connected to the $21^{st}$ path 21, the electric signal received from the fourth matrix input unit 14a disposed at the first end of the $14^{th}$ path 14 may move to the first output unit 5a through the $14^{th}$ path 14, the fourth path switching unit 34a, and the $21^{st}$ path 21. Therefore, the electric signal received from different matrix input units (12a, 14a) may be output through the same output unit, for example, the first output unit 5a. As described above, the electric signal received from the respective first paths (e.g., the first to fourth paths 11 to 14) according to the operation of the path switching units (31a to 31d) may be applied to any one of the second paths (e.g., the $21^{st}$ to $24^{th}$ paths 21 to 24), and may be finally output to the outside through any one of the output units (5a to 5e).

At least one path switching unit (31a to 31d, 32a to 32d, 33a to 33d, 34a to 34d) may interconnect the first path (11a to 19) and the second path (21 to 29) according to a control signal received from the external processor or according to the predetermined setting information, or may disconnect the first path (11a to 19) and the second path (21 to 29) from each other.

As shown in FIG. 6, the path switching unit 30 may include a path switching unit main body 30a, a switch element 30b, and an additional path 30c.

The path switching unit main body 30a may include various constituent elements related to functions of the path switching unit 30. If necessary, the path switching unit main body 30a may form the external appearance of the path switching unit 30. The first path 10 and the second path 20 may pass through the internal part of the path switching unit main body 30a, and the first path 10 and the second path 20 may cross in the internal part of the path switching unit main body 30a. In this case, the first path 10 and the second path 20 may cross each other and may not directly contact each other as shown in 30c.

The additional path 30c other than the first path 10 and the second path 20 may be present in the path switching unit main body 30a, and the first path 10 and the second path 20 may be interconnected through the additional path 30c. The additional path 30c may be implemented using a metal circuit, a conductive metal line, or the like. The switch element 30b may be disposed at the additional path 30c.

The switch element 30b may open or close the additional path 30c, may electrically interconnect the first path 10 and the second path 20, or may disconnect the first path 10 and the second path 20 from each other.

In accordance with the embodiment, the switch element 30b may include a switching diode. The switching diode may open or close the circuit using a rectifying action of the diode. In addition, according to another embodiment of the present invention, the switch element 30b may include a tri-state-buffer. The tri-state-buffer serving as a logical element having three output states may open or close the input signal according to the open or closed state of the circuit. The first path 10 and the second path 20 may be interconnected or disconnected according to the operation state of the switching diode or the tri-state-buffer. Therefore, the electric signal passing through the first path 10 may be applied to the second path 20, or may move only along the first path 10 without passing through the second path.

Besides, the switch element 30b may be implemented as various constituent components capable of interconnecting or disconnecting two paths (10, 20).

The switch element 30b may operate by an external control signal, and various components such as circuits may be installed at the path switching unit 30a so as to transmit a control signal for the switching element 30b.

As described above, the path switching unit 30 may interconnect the first path 10 and the second path 20 or may disconnect the first path 10 and the second path 20 from each other, such that the electric signal may be applied to any one of the second paths (21 to 29). Each second path (21 to 29) is electrically connected to the specific output unit (5a to 5e), such that the switch matrix 2 may allow the input electric signal to be output to the specific output unit (5a to 5e).

Referring to FIGS. 1 and 2, the switch matrix assembly 2 may include a plurality of output units (5a to 5e). In this case, the N output units (5a to 5e) may be present in the switch matrix assembly 2 in response to the number of second paths (21 to 29).

In accordance with the embodiment, the number (N) of the output units (5a to 5e) may be less than the number of matrix input units (11a to 19a, 11b to 19b). In accordance with the embodiment, the number (N) of the output units (5a to 5e) may be equal to or higher than the number of matrix input units.

The switch matrix 2 may output the electric signal applied to the switch matrix 2 to any one of the output units (5a to 5e) through the opening or closing operation of the first to sixth switching units (3a to 3f). The switch matrix 2 may transmit the signal entered by the internal path switching units (31a to 31d, 32a to 32d, 33a to 33d, 34a to 34d) to a predetermined output unit. Therefore, the switch matrix 2 may transmit the electric signal received through the specific matrix input unit to the desired output unit (5a to 5e).

The predetermined output units (5a to 5e) may output the input signal to the outside. The output signal may be applied to the circuit connected either to the output units (5a to 5e) or to various electronic components (e.g., semiconductor chips) contained in the circuit.

Referring to FIGS. 1 and 2, at least one switching unit (3a to 3f) may be connected to the switch matrix 2, and may electrically interconnect or disconnect the switch matrix 2 and the plurality of input units (4a to 4f). For example, the first to sixth switching units (3a to 3f) may transmit or may not transmit the electric signals generated from the first to sixth input units (4a to 4f) to the switch matrix, respectively.

The switch matrix assembly 1 may include a plurality of switching units (3a to 3f). In more detail, the switch matrix assembly 1 may include 2M switching units (3a to 3f) corresponding to two times the number (M) of first paths 10, or may include a smaller number of switching units (3a to 3f) than the 2M switching units.

Each switching unit (3a to 3f) may be installed in the matrix input units (11a to 19a, 11b to 19b), and one switching units (3a to 3f) may be installed at each matrix input unit (11a to 19a, 11b to 19b).

In the same manner as in the matrix input units (11a to 19a, 11b to 19b), at least two switching units from among the plurality of switching units (3a to 3f) may be arranged to correspond to each other. For example, as shown in FIG. 1, the first switching unit 3a and the fourth switching unit 3d may be arranged to correspond to each other, the second switching unit 3b and the fifth switching unit 3e may be arranged to correspond to each other, and the third switching unit 3c and the sixth switching unit 3f may be arranged to correspond to each other. In other words, any one of the M switching units (3a to 3c) from among the 2M switching units (3a to 3f) may correspond to any one of the M switching units (3d to 3f). In more detail, in the same manner as in the matrix input unit, the k-th switching unit may correspond to the (k+M)-th switching unit, where k is a natural number of 1 or higher or a natural number of M or less.

The 2M switching units (3a to 3f) may be disposed at both ends of the switch matrix 2 in a manner that the 2M switching units (3a to 3f) are arranged to correspond to each other on the basis of the switch matrix 2. M switching units (3a to 3c) from among the 2M switching units (3a to 3f) may be arranged at one end of the switch matrix 2, and the other M switching units (3a to 3f) may be arranged at the other end located opposite to one end at which the M switching units (3a to 3c) are arranged.

In more detail, the first switching unit 3a may be arranged at the opposite side of the (M+1)-th switching unit 3d. The k-th switching unit (3a to 3c) may be arranged to correspond to the (M+k)-th switching unit (3d to 3f). In this case, the first switching unit 3a may be arranged at the matrix input unit (11a to 19a) of the first end of the first path (11 to 19). The (M+1)-th switching unit 3d may be arranged at the matrix input unit (11b to 19b) of the second end of the first path (11 to 19), such that the first switching unit 3a may be arranged to correspond to the (M+1)-th switching unit 3d.

In this case, the same number (M) of switching units (3a to 3f) may be arranged at both ends of the switching matrix 2. Therefore, the switch assembly 1 may include a total number (2M) of switching units (3a to 3f), and the 2M switching units (3a to 3f) may be two times the number (M) of the first paths 10 of the switch matrix 2 as described above.

Needless to say, according to the embodiment, the number (M1) of the switching units (3a to 3c) arranged at one end of the switch matrix 2 may be different from the number (M2) of the switching units (3d to 3f) arranged at the other end of the switch matrix 2 (where M1>M2 or M1<M2). In this case, the total number of switching units (3a to 3f) may be less than two times the number (M) of the first paths 10 of the switch matrix 2.

The respective switching units (3a to 3f) may operate on the basis of a control signal received from an external processor, and may operate according to a predefined pattern.

In accordance with the embodiment, the switching units (3a to 3c, or 3d to 3f) arranged at the same one end of the switch matrix 2 from among the respective switching units (3a to 3f) may operate independently of each other. In accordance with another embodiment, the switching units (3a to 3c, or 3d to 3f) may also operate in a mutually dependent manner.

In accordance with the embodiment, the switching units (3a and 3d, 3b and 3e, 3c and 3f) corresponding to each other may operate in a mutually dependent manner. For example, the second switching unit 3d may operate according to the operation of the first switching unit 3a, the fifth switching unit 3e may operate according to the operation of the second switching unit 3b, and the sixth switching unit 3f may operate according to the operation of the matrix switching unit 3c. In contrast, the first switching unit 3a may operate according to the operation of the fourth switching unit 3d, the second switching unit 3b may operate according to the operation of the fifth switching unit 3e, and the matrix switching unit 3c may also operate according to the operation of the sixth switching unit 3f. In the same manner as described above, the k-th switching unit may operate according to the operation of the (M+k)-th switching unit, and the (M+k)-th switching unit arranged to correspond to the k-th switching unit may operate according to the operation of the k-th switching unit.

In this case, for example, when the first switching unit 3a connects the first input unit 4a to the switch matrix 2, the fourth switching unit 3d may not connect the fourth input unit 4a to the switch matrix 2. In more detail, the other end of the switch matrix may be opened, or the switch matrix input unit may be connected to the inductor or the resistor. A detailed description thereof will hereinafter be given.

The switching units (3a to 3f) may include a plurality of connection units. In this case, the connection unit may denote a passage through which the electric signal is input or output.

Any one (hereinafter referred to as a matrix input unit) of the plurality of connection units may be arranged in the direction of the switch matrix 2, and may be connected to the switch matrix 2. In more detail, the matrix input unit may be connected to one end (11a to 19a) of the first path (11 to 19) of the input unit (e.g., the switch matrix) of the switch matrix, and other connection units may be arranged opposite to the switch matrix 2 and may be connected to the input unit (4a to 4f), inductor, or the like. Other connection units may be connected to the opening part, and the opening part may denote a disconnected part formed when the end part of a path is severed.

The first to sixth switching units (3a to 3f) may be implemented using various switches. For example, the first to sixth switching units (3a to 3f) may be implemented using a Single-Port-2-Throw (SP2T) switch, a Single-Port-3-Throw (SP3T) switch, a Single-Port-4-Throw (SP4T) switch, or a Single-Port-5-Throw (SP5T) switch. Besides, the first to sixth switching units (3a to 3f) may be implemented using various other kinds of switches.

In addition, the first to sixth switching units (3a to 3f) may have a termination function for performing the matching function to prevent the occurrence of reflection at the end of the circuit. For example, the first to sixth switching units (3a to 3f) may include a switch having a 50-ohm termination function.

The operations of the switching units (3a to 3f) and various embodiments will hereinafter be described with reference to FIGS. 7 to 25. For convenience of description, FIGS. 7 to 9, FIGS. 15 to 21, and FIGS. 22 to 23 illustrate the first path 10 of the switch matrix 2, the first switching unit 40 and the (M+1)-th switching unit 50 disposed at two second paths (21, 22) and the first path 10, and the first input unit 60 and the (M+1)-th input unit 60a connected to the respective switching units (40, 50), respectively.

The switch matrix assembly including a plurality of switching units capable of entering the signal input state or the opening state will hereinafter be described with reference to FIGS. 7 to 9.

Figure 7:
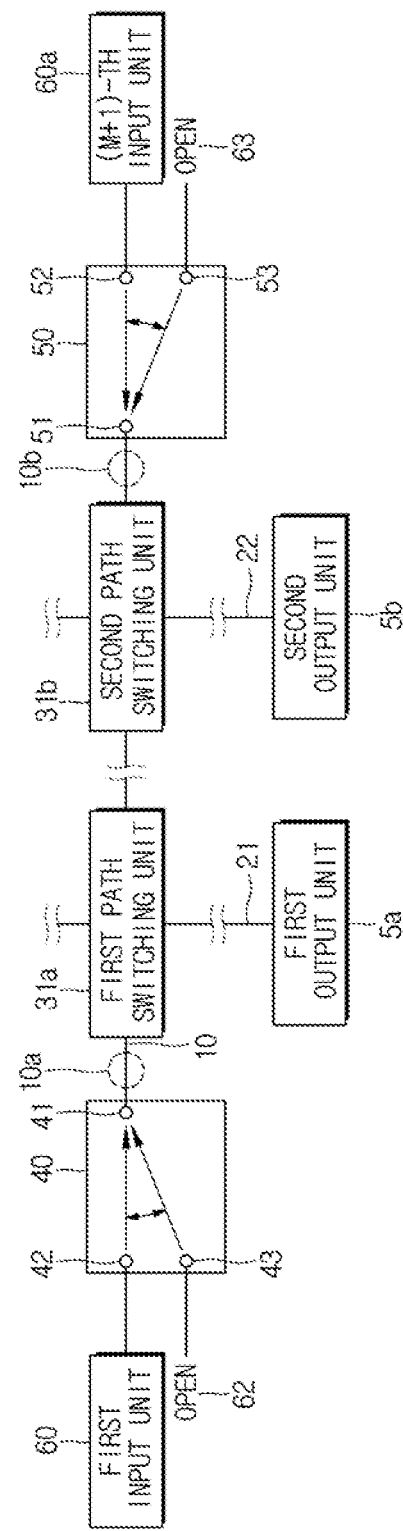
FIG. 7 is a block diagram illustrating a first switching unit and a second switching unit according to an embodiment of the present invention.

FIG. 7 is a block diagram illustrating a first switching unit and a second switching unit according to an embodiment of the present invention. FIG. 8 is a block diagram illustrating the operations of a first switching unit and a second switching unit according to an embodiment of the present invention. FIG. 9 is a block diagram illustrating the operations of a first switching unit and a second switching unit according to another embodiment of the present invention. FIGS. 8 and 9 illustrate respective operations generated in the case of FIG. 7.

Referring to FIG. 7, the switch matrix assembly 1 may include a plurality of output units (5a, 5b), a first path 10, second paths (21, 22), a plurality of switching units (31a, 31b), a first switching unit 40, a second switching unit 50, and a plurality of input units (60, 60a).

The first switching unit 40 may be connected to the first end of the first path 10, and the second switching unit 50 may be connected to the second end of the first path 10. The first path 10 may cross at least one second path (21, 22), and the first path switching unit 31a and the second path switching unit 31b may be arranged at the intersection of the first path 10 and the second paths (21, 22). The first output unit 5a and the second output unit 5b may be arranged at one end of the second paths (21, 22).

The first switching unit 40 may include a first matrix connection unit 41 connected to the first end 10a of the first path 10, and a first input unit connection unit 42 and the first opening unit 43 connected to the first input unit 60. In this case, the first switching unit 40 may be implemented as the SP2T switch.

The first matrix connection unit 41 is connected to the first end 10a of the first path 10 of the matrix 2, and may electrically connect the first switching unit 40 to the matrix 2. The first matrix connection unit 41 may input the electric signal received from the first switching unit 40 to the inside of the matrix 2, or may transmit the electric signal generated from the inside of the matrix 2 to the first switching unit 40. The first matrix connection unit 41 may be implemented using the metal circuit or the end of a conductive line, or may be implemented as a separate port or terminal.

The first input connection unit 42 may electrically connect the first input unit 60 to the first switching unit 40. The electric signal generated from the first input unit 60 may be applied to the first switching unit 40 through the first input unit connection unit 42. The first input connection unit 42 may be implemented as the metal circuit or the end of a conductive line, or may be implemented using a separate port or terminal.

The first opening unit 43 may denote an electrically disconnected part through which no more current flows. In more detail, the first opening part 43 may denote an electrically disconnected part formed when the circuit or the conductive line is severed. Therefore, if the first opening part 43 is connected to the first matrix connection unit 41, one end of the first switching unit 40 is opened such that the first end of the first path 10 is opened. As a result, one end of the first path 10 is opened.

The first switching unit 40 may interconnect the first matrix connection unit 41 and the first input unit connection unit 42 according to the predefined setting or the external control command, or may interconnect the first matrix connection unit 41 and the first opening unit 43. Therefore, the first switching unit 40 may electrically interconnect the first input unit 60 and the first path 10, or may open the first end of the first path 10.

The second switching unit 50 may include a second matrix connection unit 51 connected to the second end of the first path 10, and a second input unit connection unit 52 and a second opening unit 53 connected to the second input unit 60a. In this case, the second switching unit 50 may be implemented as the SP2T switch.

The second matrix connection unit 51 may be connected to the second end 10b of the first path 10, such that the second switching unit 50 can be electrically connected to the matrix 2. The second matrix connection unit 51 may input the electric signal received from the second switching unit 50 to the matrix 2, or may transmit the electric signal generated from the matrix 2 to the second switching unit 50. The second matrix connection unit 51 may be implemented using the metal circuit or the end of a conductive line, or may be implemented using a separate port or terminal.

The second input unit connection unit 52 may electrically interconnect the second input unit 60a and the second switching unit 50, and the electric signal generated from the second input unit 60a may be applied to the second switching unit 50 through the second input unit connection unit 52. The second input unit connection unit 52 may be implemented using the metal circuit or the end of a conductive line, or may be implemented using a separate port or terminal.

The second opening unit 53 may denote an electrically disconnected part through which no more current flows. If the second opening unit 53 is connected to the second matrix connection unit 51, the second switching unit 50 is opened such that one end of the first path 10 is opened.

The second switching unit 50 may interconnect the second matrix connection unit 51 and the second input unit connection unit 52 according to the predefined setting or the external control command. Alternatively, the second switching unit 50 may interconnect the second matrix connection unit 51 and the second opening unit 53. Therefore, the second switching unit 50 may electrically interconnect the second input unit 60a and the first path 10, or may open the second end of the first path 10.

Figure 8:
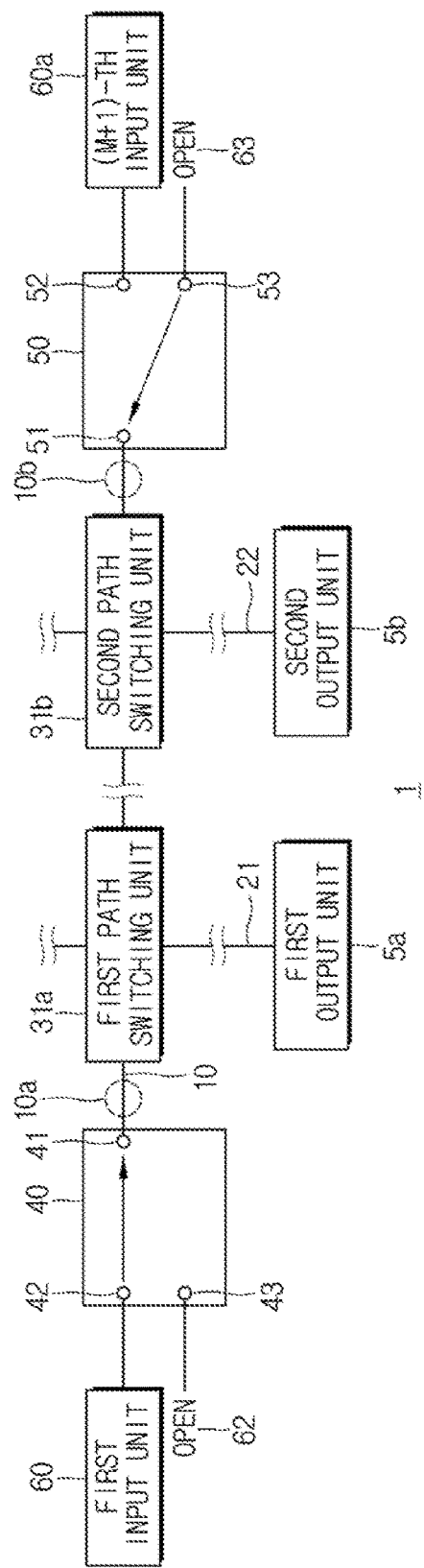
FIG. 8 is a block diagram illustrating the operations of a first switching unit and a second switching unit according to an embodiment of the present invention.

In accordance with the embodiment, as shown in FIG. 8, according to the external control signal or the predefined setting, the first switching unit 40 may interconnect the first matrix connection unit 41 and the first input unit connection unit 42, such that the electric signal obtained from the first input unit 60 may be applied to the first path 10 through the first switching unit 40. In this case, the second switching unit 50 may interconnect the first matrix connection unit 51 and the second opening unit 53 according to the external control signal or the predefined setting. The electric signal may be applied or may not be applied according to the operation of any one of the path switching units (31a, 31b). For example, assuming that any one of the path switching units (31a, 31b) connects the first path 10 to any one of the second paths (21, 22), the electric signal may be applied to any one of the second paths (21, 22) through any one of the path switching units (31a, 31b) after having passed through the first path 10. Finally, the electric signal may be applied to the output units (5a, 5b) arranged at the end of the second paths (21, 22). In the meantime, assuming that any one of the path switching units (31a, 31b) does not connect the first path 10 to the plurality of second paths (21, 22), the second end of the first path 10 does not receive the electric signal because the second end is opened according to connection between the first matrix connection unit 51 and the second opening unit 53.

Figure 9:
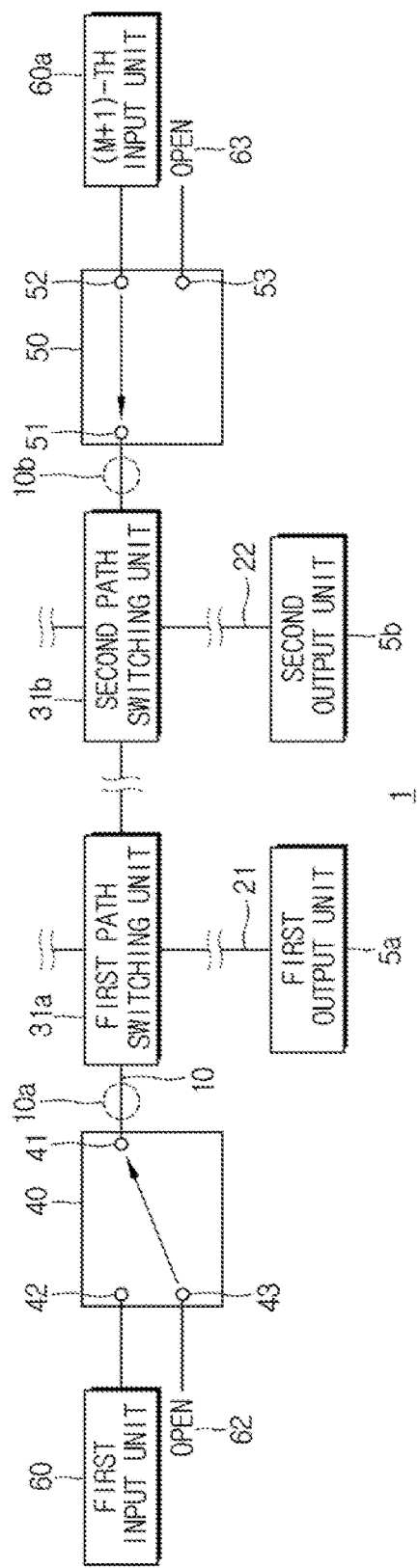
FIG. 9 is a block diagram illustrating the operations of a first switching unit and a second switching unit according to another embodiment of the present invention.

In contrast, as shown in FIG. 9, the second switching unit 50 may interconnect the second matrix connection unit 51 and the second input unit connection unit 52 according to the external control signal or the predefined setting. In contrast, the first switching unit 40 may interconnect the first matrix connection unit 41 and the first opening unit 43 according to the external control signal or the predefined setting. The electric signal obtained from the first input unit 60 may enter the first path 10 through the first switching unit 40. The electric signal may be applied to or may not be applied to the output units (5a, 5b) according to the operation of any one of the path switching units (31a, 31b). For example, assuming that any one of the path switching units (31a, 31b) connects the first path 10 to any one of the second paths (21, 22), the electric signal may be applied to any one of the second paths (21, 22) through any one of the path switching units (31a, 31b) after having passed through the first path 10. Finally, the electric signal may be output to the outside through the output units (5a, 5b). Meanwhile, assuming that any one of the path switching units (31a, 31b) does not connect the first path 10 to the plurality of second paths (21, 22), the first end of the first path 10 connected to the first switching unit 40 is opened by the first opening unit 43 such that no electric signal flows through the first end of the first path 10. As described above, since the first switching unit 40 and the second switching unit 50 are operated in opposite ways, two electric signals may not simultaneously overlap with each other through one path. In other words, assuming that the first switching unit 40 interconnects the first path 10 and the first input unit 60, if the second switching unit 50 interconnects the opening unit 53 and the first path 10 and the first switching unit 40 interconnects the first path 10 and the first opening unit 43, the second switching unit 50 interconnects the second input unit 60a and the first path 10, such that the electric signal generated from the first input unit 60 and the electric signal generated from the second input unit 60a may not overlap with each other through the first path 10.

In addition, as described above, since the electric signals from two input units (60a, 62) can be applied to one first path 10, one switch matrix 2 may receive 2M signals as an input. In other words, the switch matrix 2 can receive many more electric signals corresponding to two times the number of electric signals used in the case in which only one switching unit is disposed over the first path 10. Therefore, one switch matrix 2 may have the same performance as the (2M×N) switch matrix. Needless to say, in the case of using the (2M×N) switch matrix, the 2M electric signals can be simultaneously input. In contrast, the above-mentioned switch matrix 2 does not simultaneously receive the electric signals from the switching units (40, 50) located at both ends thereof, such that it can simultaneously receive only the M electric signals. The above-mentioned case very rarely occurs, such that the above-mentioned switch matrix 2 may substantially have the same performance as the (2M×N) switch matrix.

One situation in which capacitance occurs in the switch matrix or the other situation in which no capacitance occurs in the switch matrix will hereinafter be described with reference to FIGS. 10 to 14.

Figure 10:
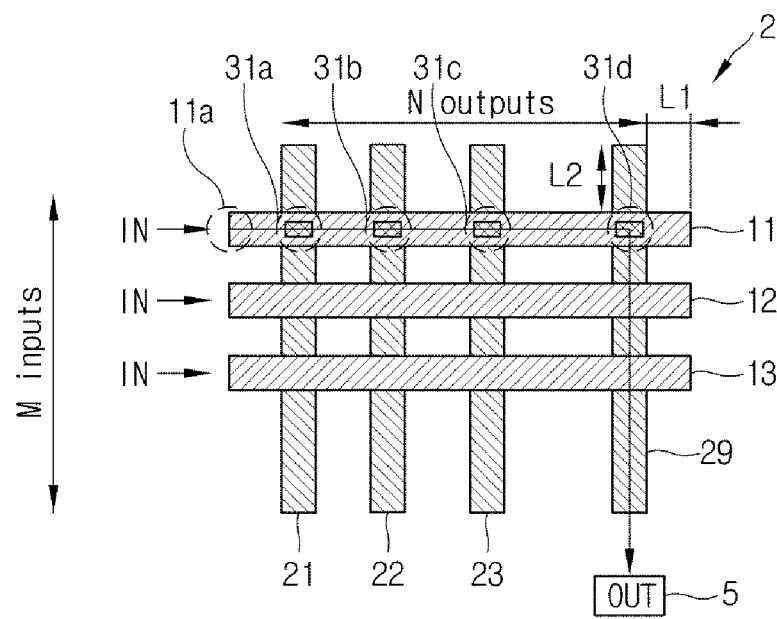
FIG. 10 is a conceptual diagram illustrating an exemplary situation in which no capacitance occurs according to the position of a turned-on path switching unit according to an embodiment of the present invention.
Figure 11:
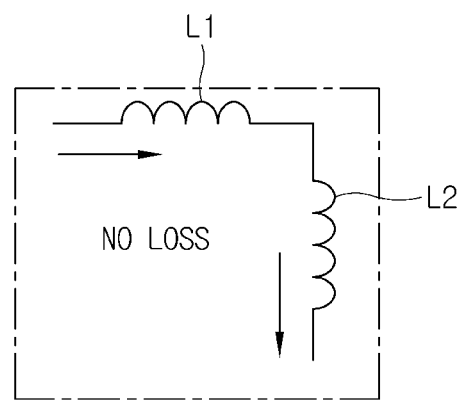
FIG. 11 is a circuit diagram illustrating an exemplary situation in which no capacitance occurs according to the position of a turned-on path switching unit according to an embodiment of the present invention.

FIG. 10 is a conceptual diagram illustrating an exemplary situation in which no capacitance occurs according to the position of a turned-on path switching unit according to an embodiment of the present invention. FIG. 11 is a circuit diagram illustrating an exemplary situation in which no capacitance occurs according to the position of a turned-on path switching unit according to an embodiment of the present invention.

Referring to FIG. 10, the switch matrix 2 may include M first paths (11 to 13), N second paths (21 to 29), and path switching units (31a to 31d) through which the respective first paths (11 to 13) and the respective second paths (21 to 29) are interconnected or disconnected. In this case, assuming that the electric signal is input to the path (e.g., the $11^{th}$ path 11) located farthest from the output unit 5, and the path switching unit 31d located farthest from the first end 11a receiving the electric signal is turned on such that the $11^{th}$ path 11 is connected to the $29^{th}$ path 29, the length (a1, a2) of the path (11, 29) located after the path switching unit 31d is short. In other words, assuming that the path switching unit 31d (located far from the first switching unit 40 connected to the first input unit 60) located adjacent to the (M+1)-th switching unit 50 not connected to the (M+1)-th input unit 60a is turned on, the length (a1) of the residual part of the $11^{th}$ path 11 or the length (a2) of the residual part of the $29^{th}$ path 29 is relatively short. In this case, the length (a1) of the residual part of the $11^{th}$ path 11 may denote the length of the remaining parts other than a specific part through which the electric signal has passed at the $11^{th}$ path 11, and the length of the residual part of the $29^{th}$ path 29 may denote a specific part through which the electric signal has passed at the $29^{th}$ path 29. In this case, since the length (a1, a2) of each residual part is very short, open-stub capacitance may not occur, or slight capacitance may occur in a manner that there is no influence. Therefore, assuming that the electric signal is input to the path 11 located farthest from the output unit 5 and the path switching unit 31d located farthest from the first end 11a receiving the electric signal is turned on, the circuit may include two inductors (L1, L2) as shown in FIG. 11. In this case, there is no loss in the electric signal.

Figure 12:
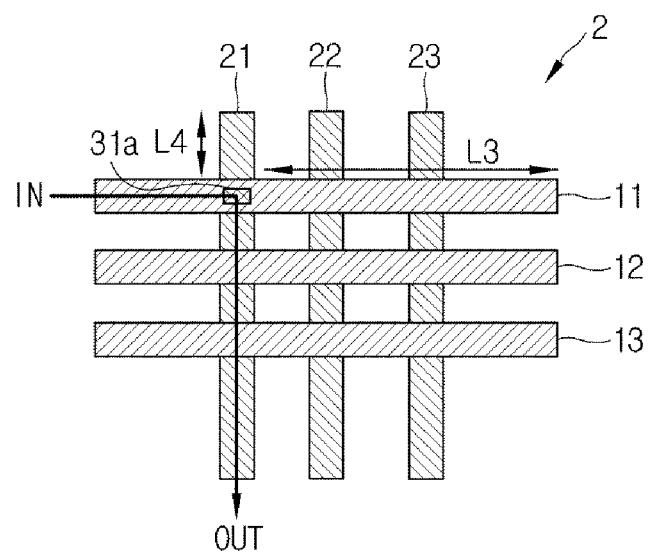
FIG. 12 is a conceptual diagram illustrating an exemplary situation in which capacitance occurs according to the position of a turned-on path switching unit according to an embodiment of the present invention.
Figure 13:
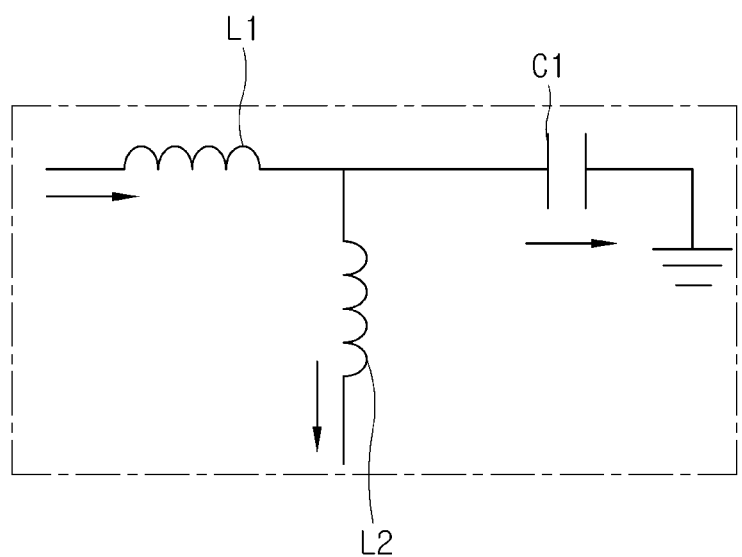
FIG. 13 is a conceptual diagram illustrating an exemplary situation in which capacitance occurs according to the position of a turned-on path switching unit according to an embodiment of the present invention.
Figure 14:
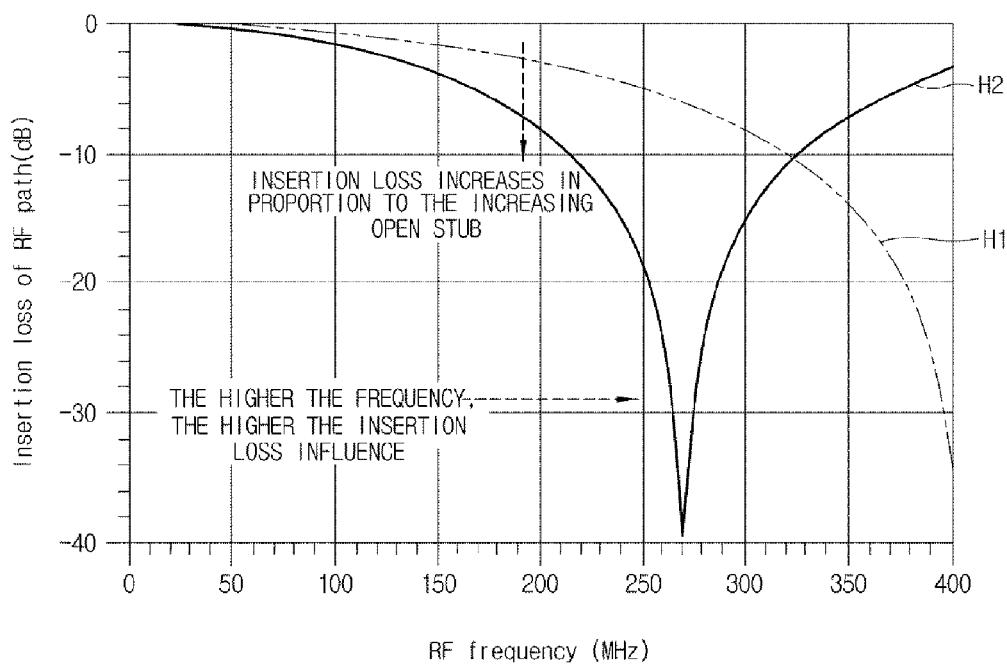
FIG. 14 is a graph illustrating RF signal loss caused by the occurrence of capacitance.

FIG. 11 is a circuit diagram illustrating an exemplary situation in which no capacitance occurs according to the position of a turned-on path switching unit according to an embodiment of the present invention. FIG. 12 is a conceptual diagram illustrating an exemplary situation in which capacitance occurs according to the position of a turned-on path switching unit according to an embodiment of the present invention. FIG. 13 is a conceptual diagram illustrating an exemplary situation in which capacitance occurs according to the position of a turned-on path switching unit according to an embodiment of the present invention. FIG. 14 is a graph illustrating RF signal insertion loss caused by the occurrence of capacitance. FIG. 14 exemplarily illustrates the relationship between insertion loss and an RF signal band. In FIG. 14, a Y-axis may denote an insertion loss generated when the RF signal is used, an X-axis may denote a frequency band, a Y-axis unit may be denoted by dB, and an X-axis unit may be denoted by MHz.

Referring to FIG. 11, assuming that the path switching unit 31a located adjacent to the first end 11a receiving the electric signal is turned on such that the $11^{th}$ path 11 is connected to the $21^{st}$ path 21 adjacent to the first end 11a, the length (a3 or a4) of the row (11 or 21) located after the path switching unit 31a may be long as shown in FIG. 12.

In more detail, assuming that the path switching unit 31a adjacent to the first switching unit 40 connected to the first input unit 4a is turned on, the length (a3) of the residual part of the $11^{th}$ path 11 is relatively long. In this case, the length of the residual part of the $11^{th}$ path 11 may denote the length of the remaining part other than a specific part through which the electric signal has passed at the $11^{th}$ path 11. In this case, since the length (a3) of the residual part is long, open-stub capacitance may occur in the residual part. In this case, as the open stub gradually increases in size, capacitance also increases in proportion to the increasing open-stub.

The circuit caused by the generated capacitance is shown in FIG. 13. In other words, the circuit may include not only two inductors (L1, L2) but also a capacitor C1 having predetermined capacitance, and a current flow not only in two inductors (L1, L2) but also in a conductive line including the capacitor C1. Therefore, loss of the electric signal occurs. In other words, signal insertion loss may occur. For example, when the length (a4) of the residual part of the second path (e.g., the $21^{st}$ path 21) is long, signal insertion loss may occur. In addition, even when the lengths (a3, a4) of the residual parts of the first path (e.g., the $11^{th}$ path 11) and the second path (e.g., the $21^{st}$ path 21) are long, signal insertion loss may also occur.

Referring to FIG. 14, although the frequency of the RF signal increases as shown in the H1 curve in this situation, insertion loss may increase along a gentle slope. In other words, as the frequency increases, the influence of insertion loss also gradually increases. However, as described above, if the open-stub capacitance occurs, the insertion loss more abruptly increases than in the identical situation as shown in the H2 curve. If the frequency is set to any one of 250 MHz to 300 MHz, insertion loss of −20 dB or greater may occur. Specifically, if the frequency is set to 270 MHz, insertion loss of about −40 dB may occur.

Therefore, as the length of the residual part of each path (10 or 20) increases, the open stub also increases in size, such that capacitance also increases, resulting in increased insertion loss. In addition, the higher the frequency, the higher the insertion loss. Therefore, assuming that the crossbar switch matrix is used in the magnetic resonance imaging (MRI) apparatus, if a large-sized magnetic resonance imaging (MRI) apparatus is fabricated so that the crossbar switch matrix is also increased in size, or if the magnetic field of the magnetic resonance imaging (MRI) apparatus is gradually increased so that the acquired free induction decay (FID) signal has a higher frequency, insertion loss of the magnetic resonance imaging (MRI) apparatus unavoidably increases so that an unexpected problem may occur.

In this case, if the signals are input through both ends of the switching matrix 2 as described above, the switch matrix may be relatively reduced in size, so that insertion loss of the electric signal is relatively reduced. Meanwhile, the above-mentioned insertion loss may be reduced or prevented by addition of the inductor.

The switch matrix including the switching unit by which the inductor can further be switched will hereinafter be described with reference to FIGS. 15 to 20.

Figure 15:
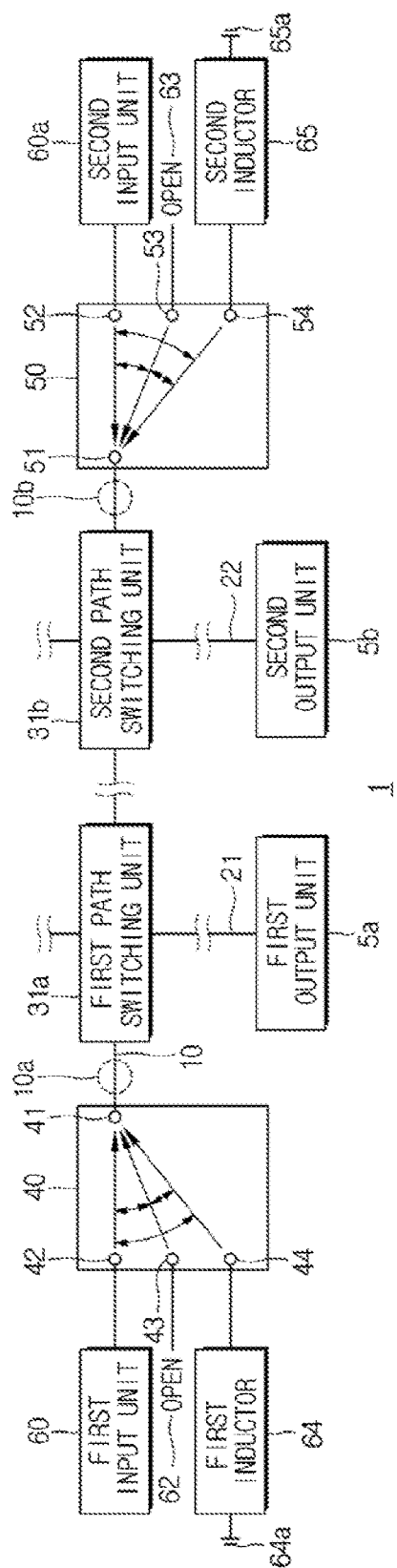
FIG. 15 is a block diagram illustrating a switch matrix assembly further including an inductor according to an embodiment of the present invention.
Figure 16:
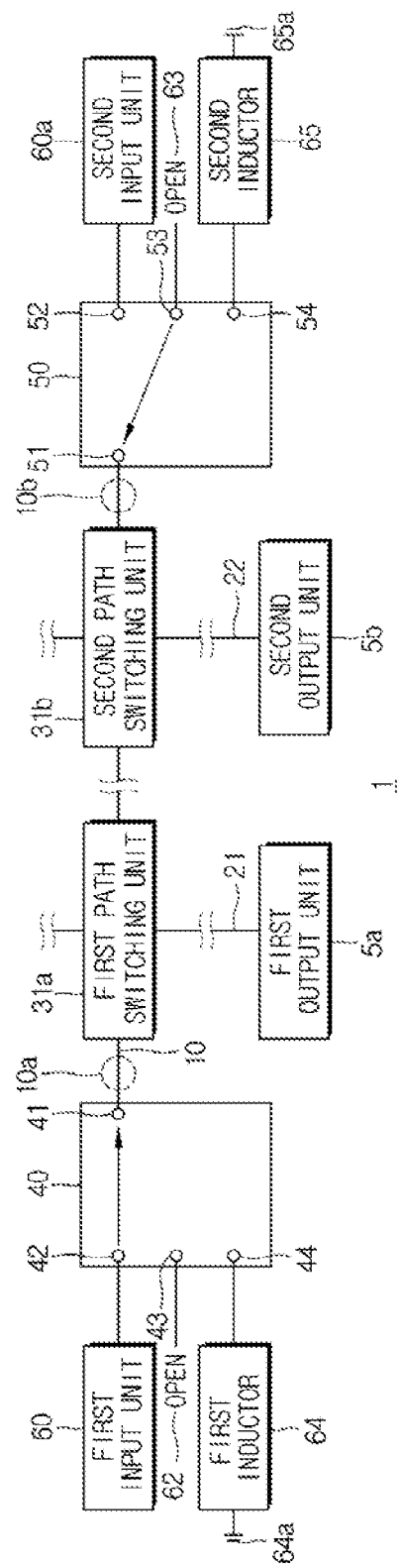
FIG. 16 is a conceptual diagram illustrating the operations of a switch matrix assembly further including an inductor according to an embodiment of the present invention.
Figure 17:
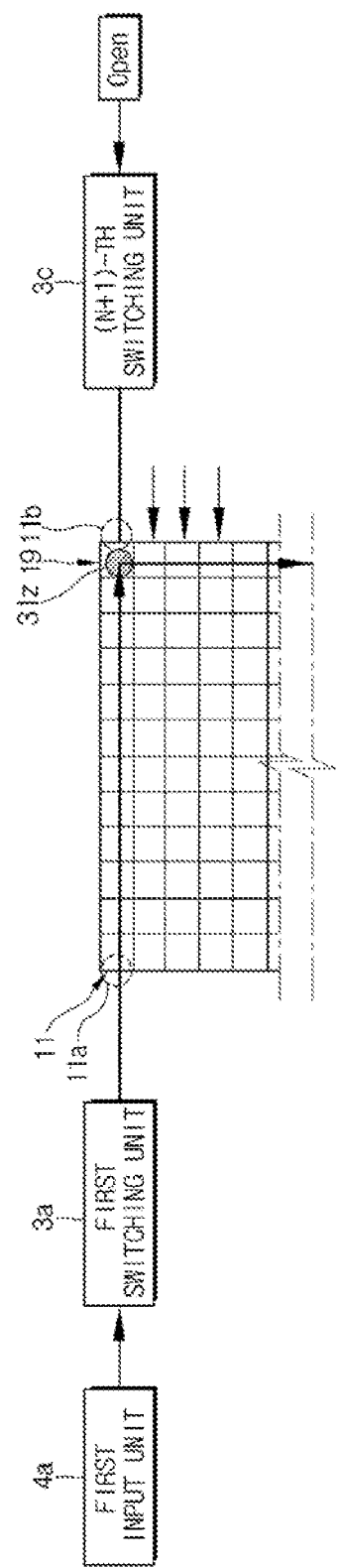
FIG. 17 is a conceptual diagram illustrating other operations of the switch matrix assembly further including the inductor according to an embodiment of the present invention.
Figure 18:
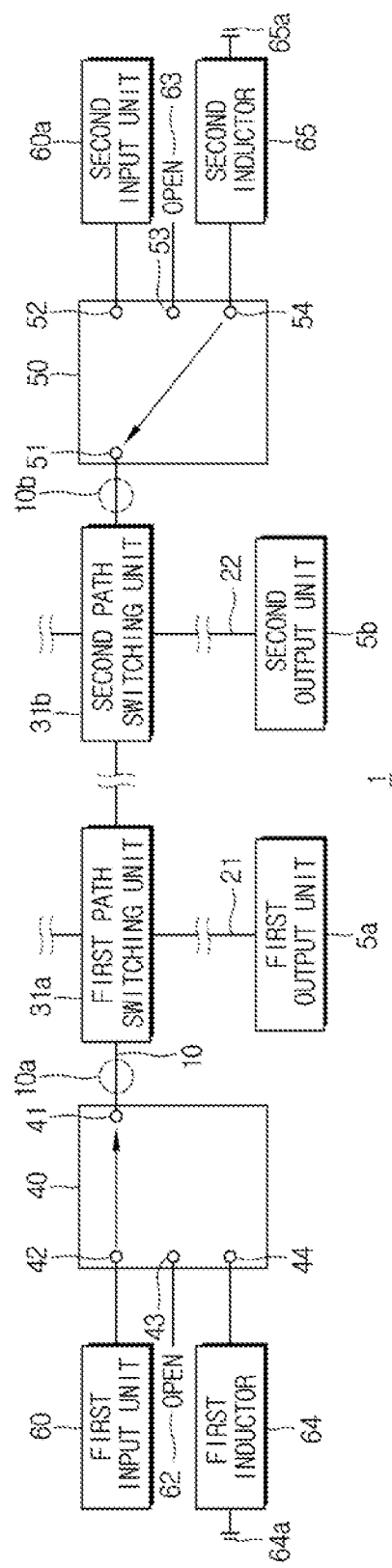
FIG. 18 is a conceptual diagram illustrating the operations of a switch matrix assembly further including an inductor according to an embodiment of the present invention.
Figure 19:
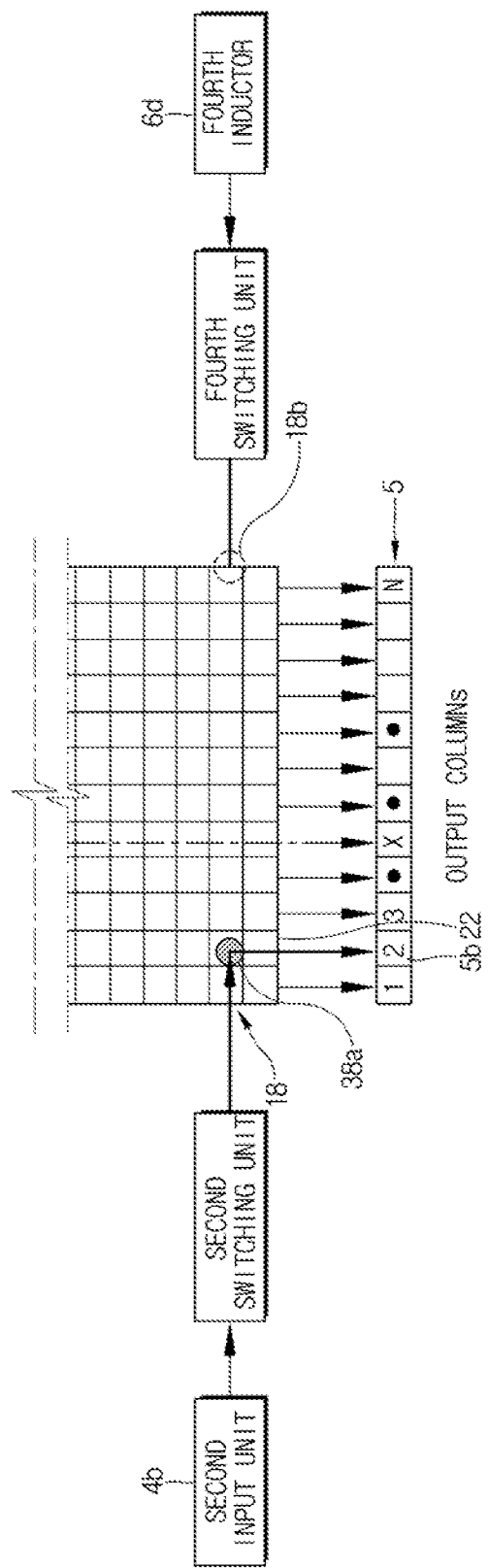
FIG. 19 is a conceptual diagram illustrating other operations of the switch matrix assembly further including the inductor according to an embodiment of the present invention.

FIG. 15 is a block diagram illustrating a switch matrix assembly further including an inductor according to an embodiment of the present invention. FIG. 16 is a conceptual diagram illustrating the operations of a switch matrix assembly further including an inductor according to an embodiment of the present invention. FIG. 17 is a conceptual diagram illustrating other operations of the switch matrix assembly further including the inductor according to an embodiment of the present invention. FIG. 18 is a conceptual diagram illustrating the operations of a switch matrix assembly further including an inductor according to an embodiment of the present invention. FIG. 19 is a conceptual diagram illustrating other operations of the switch matrix assembly further including the inductor according to an embodiment of the present invention.

Referring to FIGS. 15 to 17, the switch matrix assembly 1 may include a plurality of output units (5a, 5b), a first path 10, second paths (21, 22), a plurality of path switching units (31a, 31b), a first switching unit 40, a second switching unit 50, a plurality of input units (60, 60a), a first inductor 64, and a second inductor 65.

In the same manner as described above, the first switching unit 40 may be connected to the first end 10a of the first path 10, and the second switching unit 50 may be connected to the second end 10b of the first path 10. The first path 10 may cross at least one second path (21, 22), and the first path switching unit 31a and the second path switching unit 31b may be arranged at the intersection of the first path 10 and the second paths (21, 22). The first output unit 5a may be arranged at one end of the second path 21, and the second output unit 5b may be arranged at one end of the second path 22.

The first switching unit 40 may include a first matrix connection unit 41 connected to the first end 10a of the first path 10, the first input unit connection unit 42 connected to the first input unit 60, and the first opening unit 43 and the first inductor connection unit 44. In this case, the first switching unit 40 may be implemented as the SP3T switch.

The first matrix connection unit 41 may be connected to the first end 10a of the first path 10 of the matrix 2, and may electrically connect the first switching unit 40 to the matrix 2. The first matrix connection unit 41 may input the electric signal having passed through the first switching unit 40 to the matrix 2, or may transmit the electric signal generated from the matrix 2 to the first switching unit 40.

The first input unit connection unit 42 may electrically connect the first input unit 60 to the first switching unit 40. The electric signal generated from the first input unit 60 may be applied to the first switching unit 40 through the first input unit connection unit 42.

The first opening unit 43 may denote an electrically disconnected part through which no more current flows. Assuming that the first opening unit 43 is connected to the first matrix connection unit 41, one end of the first switching unit 40 is opened such that one end of the first path 10 is also opened.

The first inductor connection unit 44 may electrically interconnect the first inductor 64 and the first switching unit 40. In accordance with the embodiment, only one first inductor connection unit 44 or at least two first inductor connection units 44 may be contained in the first switching unit 40. If at least two first inductor connection units 44 are present in the first switching unit 40, the first switching unit 40 may also be implemented using the SP4T switch, the SP5T switch, the SP6T switch, or the SPnT switch (where n is a natural number of 4 or higher) according to the number of first inductor connection units 44.

The first inductor 64 may be an electronic component configured to acquire inductance from the electric circuit, may be implemented not only as a metal line formed of copper (Cu) or aluminum (Al) but also as an insulation material contained in the metal line, and may induce a voltage in proportion to the change amount of a current. One end of the first inductor 64 may be connected to the first inductor connection unit 44, and the other end thereof may be grounded as shown in 64a. If the first inductor connection unit 44 is connected to the first matrix connection unit 41, the first inductor 64 can be connected to the first end 10a of the first path 10, such that capacitance generated from the first path 10 can be compensated for.

In accordance with the embodiment, only one first inductor 64 or at least two first inductors 64 may be contained in the first switching unit 40. At least two first inductors 64 may be respectively connected to at least two first inductor connection units 44. Two or more first inductors 64 may have different inductances. Therefore, the first switching unit 40 may interconnect the first path 10 and the first inductor 64 capable of selectively inducing a predetermined inductance from among the first inductors 64 having different inductances. The first inductor 64 having proper inductance from among two or more first inductors 64 may be connected to the first path 10. In this case, the first inductor 64 having proper inductance may denote a first inductor configured to induce inductance capable of properly compensating for capacitance generated from the first path 10.

Referring to FIGS. 16 and 17, the first switching unit 40 may interconnect the first matrix connection unit 41 and the first input unit connection unit 42 according to the predefined setting or the external control command, may interconnect the first matrix connection unit 41 and the first opening unit 43, or may interconnect the first matrix connection unit 41 and the first inductor connection unit 44. In this case, the first switching unit 40 may connect any one of the first inductor connection units 44 to the first matrix connection unit 41. Therefore, the first switching unit 40 may electrically interconnect the first input unit 60 and the first path 10, may open the first end 10a of the first path 10, or may interconnect the first end 10a of the first path 10 and the first inductor 64. In addition, the first switching unit 40 may also connect the first inductor 64 having proper inductance from among the plurality of first inductors 64 to the first end 10a of the first path 10 according to the magnitude of capacitance generated by the open stub.

The second switching unit 50 may include a second matrix connection unit 51 connected to the second end of the first path 10, a second input unit connection unit 52 connected to the second input unit 60a, a second opening unit 53, and a second inductor connection unit 54. In this case, the second switching unit 50 may be implemented as the SP3T switch.

In the same manner as described above, the second matrix connection unit 51 is coupled to the second end of the first path 10, such that the second switching unit 50 can be electrically connected to the matrix 2. The second matrix connection unit 51 may input the electric signal having passed through the second switching unit 50 to the matrix 2, or may output the electric signal generated from the matrix 2 to the second switching unit 50.

The second input unit connection unit 52 may electrically interconnect the second input unit 60a and the second switching unit 50, and the electric signal generated from the second input unit 60a may be applied to the second switching unit 50 through the second input unit connection unit 52.

The second opening unit 53 may denote an electrically disconnected part through which no more current flows. If the second opening unit 53 is connected to the second matrix connection unit 51, the second end of the first path 10 is opened.

The second inductor connection unit 54 may electrically interconnect the second inductor 65 and the second switching unit 50. Only one second inductor connection unit 54 or a plurality of second inductor connection units 54 may be contained in the second switching unit 50. The second switching unit may be implemented using the SP3T switch, the SP4T switch, or the SP5T switch according to the number of second inductor connection units 54.

The second inductor 65 may induce a voltage in proportion to the change amount of a current. If the second inductor connection unit 54 is connected to the second matrix connection unit 51, the second inductor 65 may be connected to the second end 10b of the first path 10. One end of the second inductor 65 may be connected to the second inductor connection unit 54, and the other end of the second inductor 65 may be grounded as shown in 65a. In accordance with the embodiment, only one second inductor 65 or at least two second inductors 65 may be connected to the second switching unit 50. At least two second inductors 65 may be respectively connected to at least two second inductor connection units 54.

In accordance with the embodiment, the second switching unit 50 may select any one of the second inductors 65, and may also connect the selected second inductor 65 to the second end 10b of the first path 10. The plurality of second inductors 65 may be respectively connected to the plurality of second inductor connection units 54. The plurality of second inductors 65 may have different inductances. One second inductor 65 capable of inducing specific inductance from among the plurality of second inductors 65 may be connected to the first path 10 according to the operation of the second switching unit 50. Therefore, the second inductor 65 having proper inductance may be selectively connected to the first path 10. In this case, the second inductor 65 having proper inductance may be a second inductor configured to induce inductance capable of properly compensating for capacitance generated from the first path 10.

In the same manner as in FIGS. 16 and 17, the second switching unit 50 may interconnect the second matrix connection unit 51 and the second input unit connection unit 52 according to the predefined setting or the external control command. Alternatively, the second switching unit 50 may interconnect the second matrix connection unit 5q and the second opening unit 53, or may interconnect the second matrix connection unit 51 and the second inductor connection unit 54. In this case, the second switching unit 50 may also connect any one of the second inductor connection units 54 to the second matrix connection unit 51. Therefore, the second switching unit 50 may electrically interconnect the second input unit 60a and the first path 10, may open the second end 10b of the first path 10, or may interconnect the second end 10b of the first path 10 and the second inductor 65. In addition, the second switching unit 50 may connect any one of the second inductors 54 to the second end 10b of the first path 10.

In accordance with the embodiment, assuming that the first switching unit 40 interconnects the first matrix connection unit 41 and the first input unit connection unit 42 according to the external control command or the predefined setting, the second switching unit 50 may interconnect the second matrix connection unit 51 and the second opening unit 53 according to the external control command or the predefined setting, or may interconnect the second matrix connection unit 51 and the second inductor connection unit 54.

In this case, the second switching unit 50 may interconnect the second matrix connection unit 51 and the second opening unit 53 according to the presence or absence of open-stub capacitance, or may interconnect the second matrix connection unit 51 and the second inductor connection unit 54. In more detail, assuming that no capacitance occurs in the first path 10 or the second path (21, 22), the second switching unit 50 may interconnect the second matrix connection unit 51 and the second opening unit 53 as shown in FIG. 16. In contrast, assuming that capacitance occurs in the first path 10 or the second path (21, 22), the second switching unit 50 may interconnect the second matrix connection unit 51 and the second inductor connection unit 54 as shown in FIG. 17.

For example, as shown in FIG. 18, the first switching unit 3a interconnects the $11^{th}$ path 11 and the first input unit 4a located at the outside, such that the electric signal can be input through the first end 11a of the $11^{th}$ path 11. In this case, assuming that the path switching unit 31z adjacent to the third switching unit 3c corresponding to the first switching unit 3a is turned on such that the residual part is reduced in size, the third switching unit 3c may operate in a manner that the second end 11b of the $11^{th}$ path 11 can be opened. If the residual part is reduced in size, little open-stub capacitance or a very low open-stub capacitance occurs, such that no insertion loss or little insertion loss may occur even though the second end 11b of the $11^{th}$ path 11 is opened. The input electric signal is applied to the $11^{th}$ path 11 through the first switching unit 3a, is then applied to the $29^{th}$ path 29 through the path switching unit 31z, and is finally output through one output unit 5z from among the plurality of output units 5.

In addition, for example, as shown in FIG. 19, assuming that the second switching unit 3b interconnects the $18^{th}$ path 18 and the external second input unit 4b, the electric signal may be input through the first end 18a of the $18^{th}$ path 18. In this case, assuming that the path switching unit 38a located far from the fourth switching unit 3d corresponding to the second switching unit 3b is turned on, if the residual part of at least one of the $18^{th}$ path 18 and the $22^{nd}$ path 22 is increased in size, the fourth switching unit 3d may be configured in a manner that the second end 18b of the $18^{th}$ path 18 can be connected to the fourth inductor 6d. If the residual part is large in size, high capacitance based on the open stub occurs as described above. In this case, as shown in FIGS. 17 and 19, if the inductors (65, 6d) are connected to the second end (10b or 18b) of the first path 10 or the $18^{th}$ path 18, the circuit may be formed as shown in FIG. 20a.

Figure 20A:
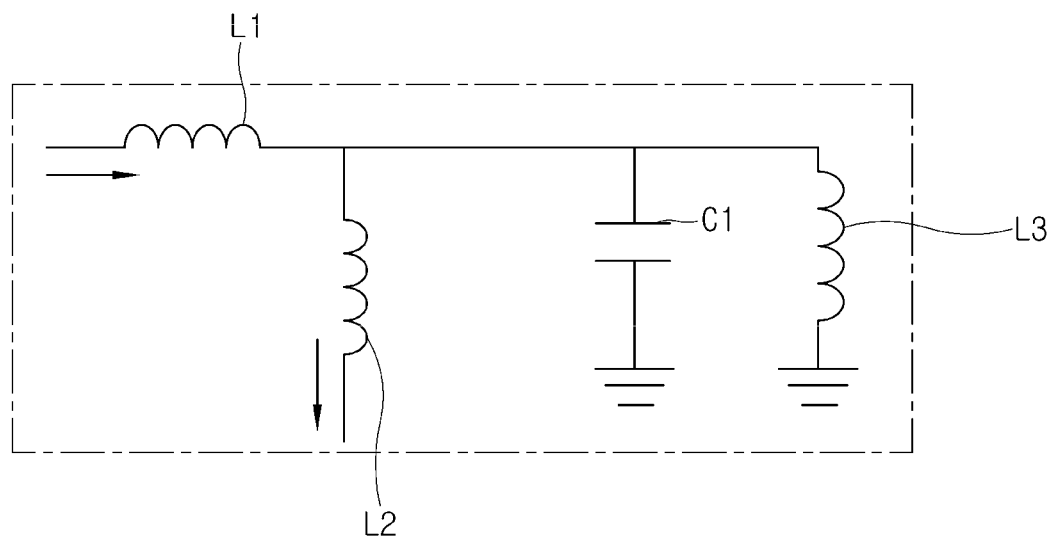
FIG. 20A is a circuit diagram illustrating loss compensation caused by the occurrence of capacitance.
Figure 20B:
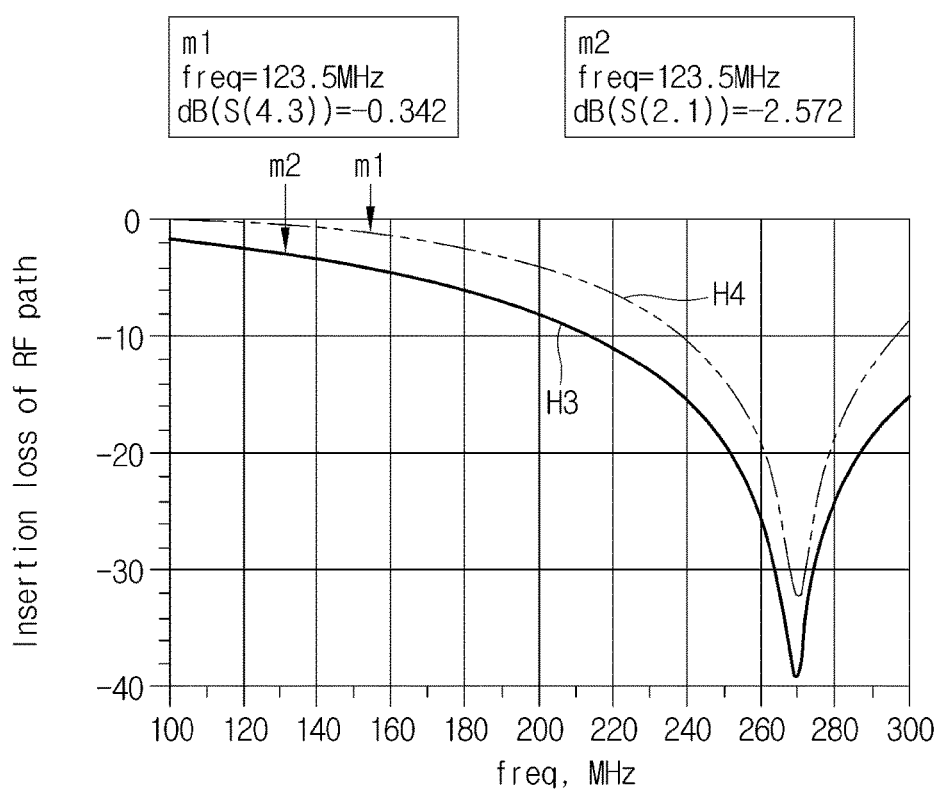
FIG. 20B is a graph illustrating loss compensation caused by the occurrence of capacitance.

FIG. 20A is a circuit diagram illustrating loss compensation caused by the occurrence of capacitance. FIG. 20B is a graph illustrating loss compensation caused by the occurrence of capacitance. In FIG. 20B, a Y-axis may denote an insertion loss generated when the RF signal is used, an X-axis may denote a frequency band, a Y-axis unit may be denoted by dB, and an X-axis unit may be denoted by MHz.

Referring to FIG. 20A, although the circuit further includes the capacitor (C1), no current or little current flows in the capacitor C1 through a separate third inductor L3. Therefore, the capacitance effect of the capacitor C1 can be compensated for, and a current mainly flows in two inductors (i.e., a first inductor L1 and a second inductor L2), such that insertion loss can be reduced.

Referring to FIG. 20B, assuming that the inductors (65, 6d) are not present, insertion loss may greatly increase according to the increasing capacitance or frequency as shown in the H3 curve. For example, assuming that the frequency is set to 123.5 MHz, the insertion loss may be set to about −2.572 (dB(S(2.1))=−2.572).

However, assuming that the inductors (65, 6*d*) are connected to the second ends (10*b*, 18*b*) of the paths (10, 18) by the switching units (50, 3*d*) corresponding to the switching units (40, 3*b*) receiving the electric signal, the capacitance effect is compensated for by the inductors (65, 6*d*), such that insertion loss can be relatively reduced as shown in the H4 curve. For example, assuming that the frequency is set to 123.5 MHz, the insertion loss may be set to about −0.342 (dB(S(4.3))=−0.342).

Therefore, the electric signal insertion loss caused by the increasing capacitance generated when the residual part of each path is increased in length can be greatly reduced. In addition, when the crossbar switch matrix increases in size according to the large-sized MRI apparatus, or when a high-frequency FID signal is input to the MRI apparatus, signal insertion loss can be prevented from increasing in the MRI apparatus.

Meanwhile, as shown in FIG. 19, the input electric signal is transmitted to the $18^{th}$ path 18 through the second switching unit 3*b*, is applied to the $22^{nd}$ path 22 through the path switching unit 38*a*, and is finally output through one output unit 5*b* from among the plurality of output units 5.

The switch matrix assembly including the switching unit capable of being connected to an additional resistor according to the embodiment will hereinafter be described with reference to the attached drawings.

Figure 21:
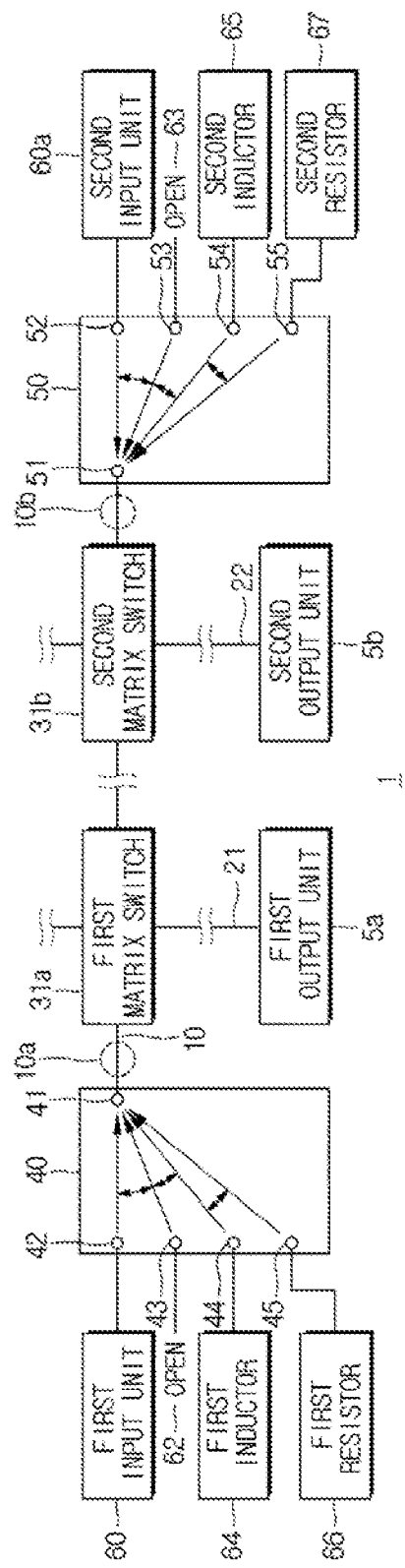
FIG. 21 is a conceptual diagram illustrating a switch matrix assembly further including a resistor according to an embodiment of the present invention.
Figure 22:
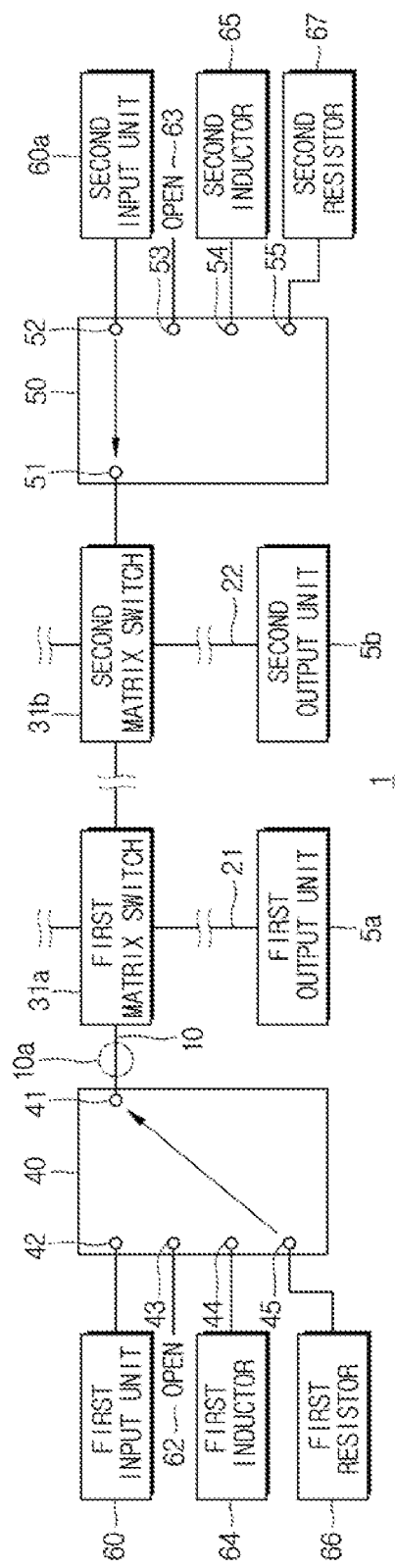
FIG. 22 is a conceptual diagram illustrating the operations of a switch matrix assembly further including a resistor according to an embodiment of the present invention.
Figure 23:
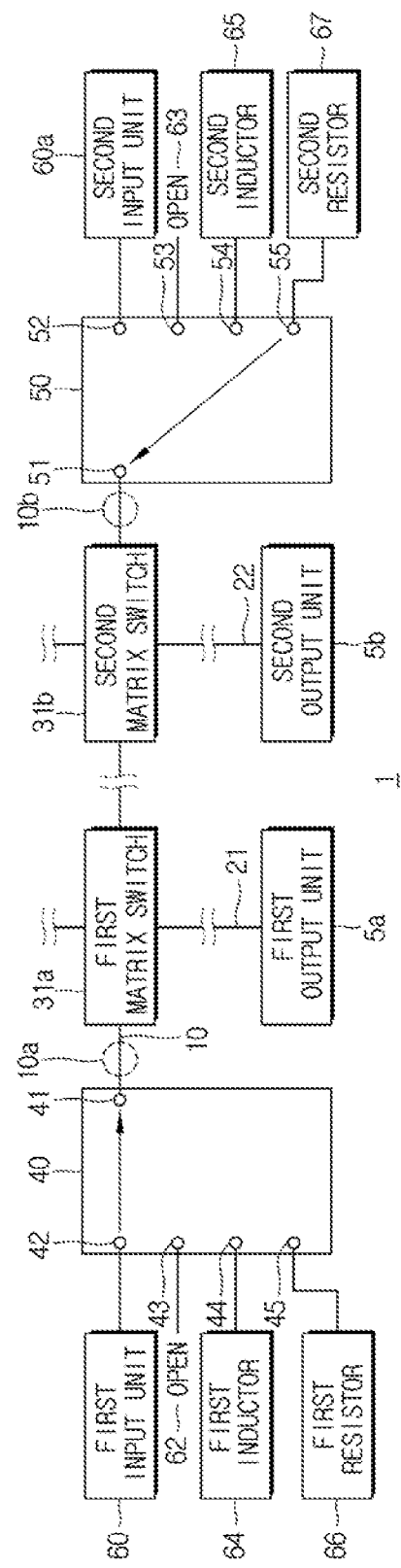
FIG. 23 is a conceptual diagram illustrating the operations of a switch matrix assembly further including a resistor according to another embodiment of the present invention.

FIG. 21 is a conceptual diagram illustrating a switch matrix assembly further including a resistor according to an embodiment of the present invention. FIG. 22 is a conceptual diagram illustrating the operations of a switch matrix assembly further including a resistor according to an embodiment of the present invention. FIG. 23 is a conceptual diagram illustrating the operations of a switch matrix assembly further including a resistor according to another embodiment of the present invention.

Referring to FIGS. 21 to 23, the switch matrix assembly 1 may include a plurality of output units (5*a*, 5*b*), a first path 10, second paths (21, 22), a plurality of path switching units (31*a*, 31*b*), a first switching unit 40, a second switching unit 50, a plurality of input units (60, 60*a*), a first inductor 64, a second inductor 65, a first resistor 66, and a second resistor 67.

In the same manner as described above, the first switching unit 40 may be connected to the first end 10*a* of the first path 10, and the second switching unit 50 may be connected to the second end 10*b* of the first path 10. The first path 190 may be arranged to cross at least one second path (21, 22), and the first path switching unit 31*a* and the second path switching unit 31*b* may be arranged at the intersection of the first path 10 and the second paths (21, 22). The first output unit 5*a* or the second output unit 5*b* may be arranged at one end of the second path (21 or 22).

The first switching unit 40 may include a first matrix connection unit 41 connected to the first end 10*a* of the first path 10, a first input unit connection unit 42 connected to the first input unit 60, a first opening unit 43, a first inductor connection unit 44, and a first resistor connection unit 45. In this case, the first switching unit 40 may be implemented as the SP4T switch.

The first matrix connection unit 41 may be combined with the first end 10*a* of the first path 10 of the matrix 2, such that the first switching unit 40 can be electrically connected to the matrix 2. The first matrix connection unit 41 may input the electric signal having passed through the first switching unit 40 to the matrix 2, or may output the electric signal generated from the matrix 2 to the first switching unit 40.

The first input unit connection unit 42 may electrically interconnect the first input unit 60 and the first switching unit 40, and the electric signal generated from the first input unit 60 may be applied to the first switching unit 40 through the first input unit connection unit 42.

The first opening unit 43 may denote an electrically disconnected part through which no more current flows. If the first opening unit 43 is connected to the first matrix connection unit 41, one end of the first switching unit 40 is opened such that one end 10*a* of the first path 10 is opened.

The first inductor connection unit 44 may electrically interconnect the first inductor 64 and the first switching unit 40.

The first resistor connection unit 45 may electrically interconnect the first resistor 66 and the first switching unit 40.

The first resistor 55 may be selectively connected to the first matrix connection unit 41 of the first switching unit 40. The first resistor 66 may have resistance of 40 to 60 ohm. Specifically, the first resistor 66 may have resistance of 50 ohm. The first resistor 55 may be implemented using various constituent components configured to perform a resistor function in a circuit.

Assuming that the first resistor 66 is connected to the first path 10, the first resistor 66 may perform the matching function (i.e., the termination function) to prevent the occurrence of reflection at the end of the first path 10 of the switch matrix 2, or may prevent the occurrence of oscillation in the circuit.

In this case, one end of the first resistor 66 is connected to the first matrix connection unit 41 of the first switching unit 40, and the other end of the first resistor 66 is connected to the circuit or the conductive line. In this case, the circuit or the conductive line connected to the other end of the first resistor 66 may be grounded or opened.

Referring to FIGS. 21 and 22, the first switching unit 40 may interconnect the first matrix connection unit 41 and the first input unit connection unit 42 according to the pre-defined setting or the external control command, may interconnect the first matrix connection unit 41 and the first opening unit 43, may interconnect the first matrix connection unit 41 and the first inductor connection unit 44, or may interconnect the first matrix connection unit 41 and the first resistor connection unit 45. Therefore, the first switching unit 40 may electrically interconnect the first input unit 60 and the first path 10, may open the first end 10*a* of the first path 10, may interconnect the first end 10*a* of the first path 10 and the first inductor 64, or may interconnect the first end 10*a* of the first path 10 and the first resistor 66.

In the same manner as in the first switching unit 40, the second switching unit 50 may include a second matrix connection unit 51 connected to the second end of the first path 10, a second input unit connection unit 52 connected to the second input unit 60*a*, a second opening unit 53, a second inductor connection unit 54, and a second resistor connection unit 55. In this case, the second switching unit 50 may be implemented as the SP4T switch.

The second matrix connection unit 51 is combined with the second end 10*b* of the first path 10, such that the second switching unit 50 can be electrically connected to the matrix 2.

The second input unit connection unit 52 may electrically interconnect the second input unit 60*a* and the second switching unit 50.

The second opening unit 53 may denote an electrically disconnected part through which no more current flows. If the second opening unit 53 is connected to the second matrix connection unit 51, the second end 10b of the first path 10 is opened.

The second inductor connection unit 54 may electrically interconnect the second inductor 65 and the second switching unit 50.

The second resistor connection unit 55 may electrically interconnect the second resistor 67 and the first switching unit 40.

For example, the second resistor 67 may have resistance of 40 to 60 ohm. Specifically, the second resistor 67 may have resistance of 50 ohm. The second resistor 67 may be implemented using various constituent components configured to perform a resistor function in the circuit.

The second resistor 67 may be selectively connected to the second matrix connection unit 51 of the second switching unit 50. In the same manner as in the first resistor 66, the second resistor 67 may perform the termination function of the switch matrix 2, or may prevent the occurrence of oscillation in the circuit.

One end of the second resistor 67 is connected to the second matrix connection unit 51 of the second switching unit 50, and the other end of the second resistor 67 is connected to the circuit or the conductive line. In this case, the circuit or the conductive line connected to the other end of the second resistor 67 may be grounded or opened.

Referring to FIGS. 22 and 23, the first switching unit 40 or the second switching unit 50 may be switched to connect to the first resistor 66 or the second resistor 67. Therefore, the first end 10a of the first path 10 may be connected to the first resistor 66 or the second end 10b of the first path 10 may be connected to the second resistor 67. Although the second end 10b of the first path 10 is connected to the second input unit 60a, if the second input unit 60a is not used or does need not be used, the first end 10a of the first path 10 may be connected to the first resistor 66. Therefore, the first path 10 may be terminated. In contrast, although the first input unit 60 is connected to the first end 10a of the first path 10, if the first input unit is not used or does need not be used, the second end 10b of the first path 10 may be connected to the second resistor 67. As a result, the first path 10 may be terminated in the same manner as described above.

The operations of the switch matrix assembly will hereinafter be described with reference to the attached drawings.

Figure 24:
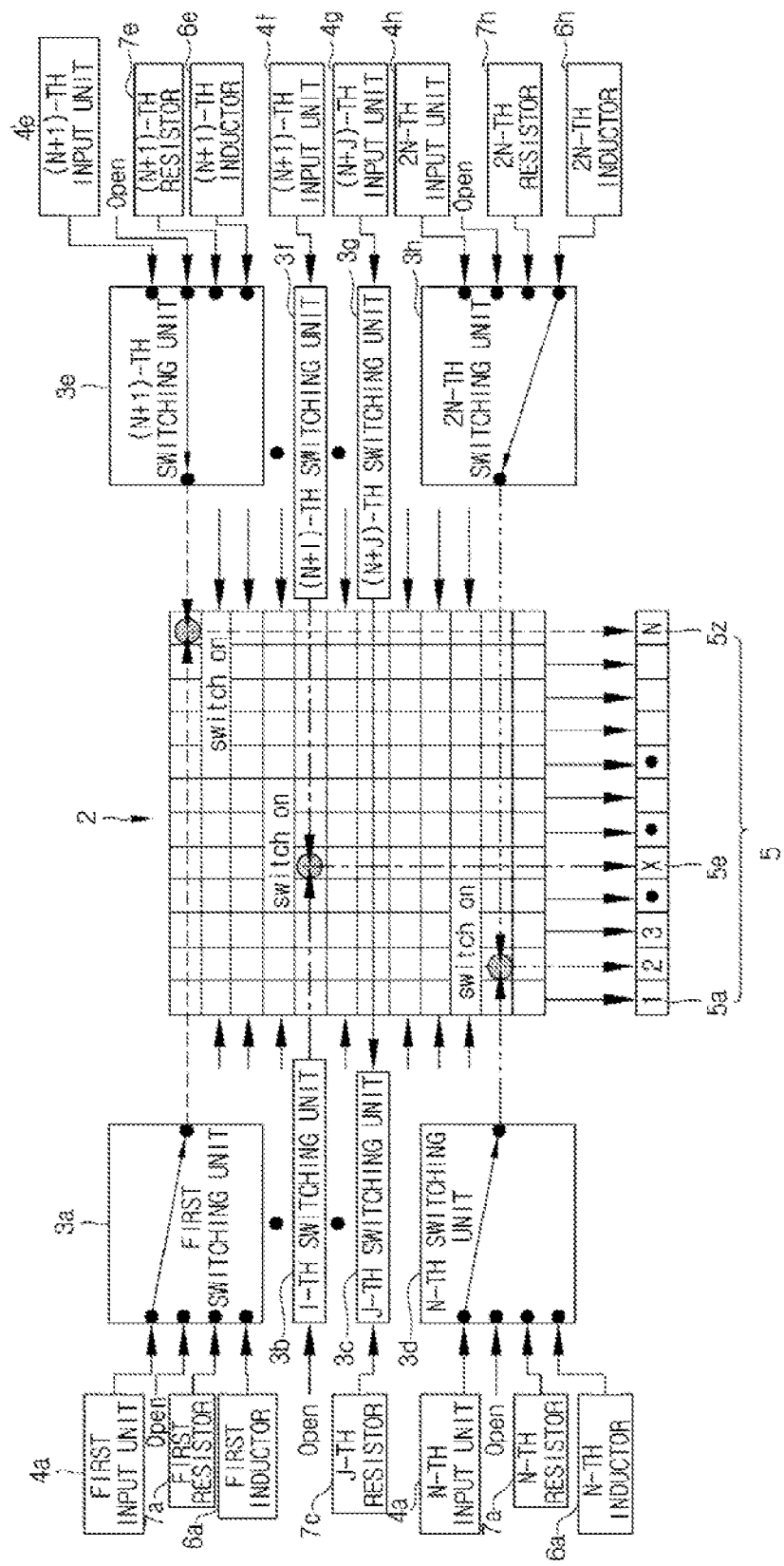
FIG. 24 is a conceptual diagram illustrating the entire operations of a switch matrix assembly according to an embodiment of the present invention.

FIG. 24 is a conceptual diagram illustrating the entire operations of a switch matrix assembly according to an embodiment of the present invention.

Referring to FIG. 24, one switch matrix 2 may include a plurality of switching units (3a to 3h). For example, some switching units (for example, the first switching unit 3a, the N-th switching unit 3d, the (N+i)-th switching unit 3f, and the (N+j)-th switching unit 3g) may be electrically connected to the first input unit 4a, the N-th input unit 4d, the (N+i)-th input unit 4f, and the (N+i)-th input unit 4g, respectively.

Assuming that no residual part or a small-sized residual part is present in the path through which not only the electric signal received from the first switching unit 3a after having been output from the first input unit 4a passes, but also the other electric signal received from the (N+i)-th switching unit 3f after having been output from the (N+1)-th input unit 4f passes, the (N+1)-th switching unit 3e corresponding to the first switching unit 3a and the i-th switching unit 3b corresponding to the (N+i)-th switching unit 3f may be opened. In other words, the (N+1)-th switching unit 3e may not connect the (N+1)-th input unit 4e, the (N+1)-th resistor 7e, or the (N+1)-th inductor 6e to the second end of the first path. In this case, since no residual part or a small-sized residual part is present in the path through which the electric signal passes, the electric signal received from the first input unit 4a and the (N+i)-th input unit 4f may be applied to the respective output units (5e, 5z) through the switch matrix 2 without generating signal insertion loss or generating little signal insertion loss.

In the meantime, since the large-sized residual part is present in the path through which the electric signal transmitted from the N-th switching unit 3d to the switch matrix 2 after having been output from the N-th input unit 4d, the 2N-th switching units 3h corresponding to the N-th switching unit 3d may be connected to the inductor 6h, and may not be connected to the 2N-th input unit 4h or the 2N-th resistor 7h. As described above, assuming that the 2N-th switching unit 3h is connected to the inductor 6h, insertion loss caused by the residual part can be reduced.

Meanwhile, the j-th switching unit 3c corresponding to the (N+j)-th switching unit 3g may be connected to the j-th resistor 7c. In this case, the electric signal received from the (N+j)-th switching unit 3g after having been received from the (N+j)-th input unit 4g may not be applied to the output unit 5. As described above, the respective switching units (3a to 3h) may operate independently of each other or may operate in a mutually dependent manner. The respective switching units (3a to 3h) may operate at the same time or at different times.

The switch matrix assembly according to another embodiment of the present invention will hereinafter be described with reference to FIGS. 25 to 28. For convenience of description and better understanding of the present invention, some switching units or some input units will herein be omitted from FIGS. 25, 27, and 28.

Figure 25:
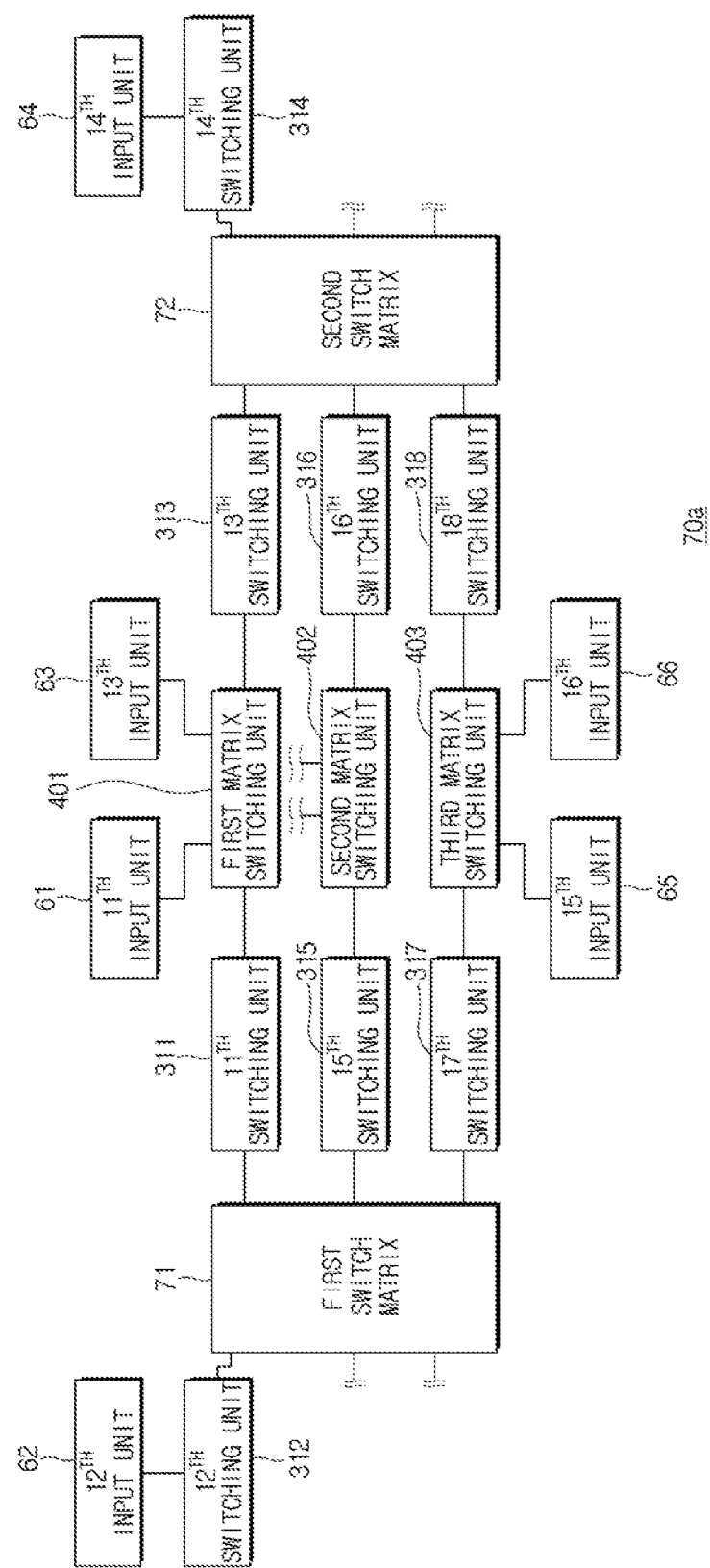
FIG. 25 is a block diagram illustrating a switch matrix assembly including a matrix switching unit according to an embodiment of the present invention.
Figure 26:
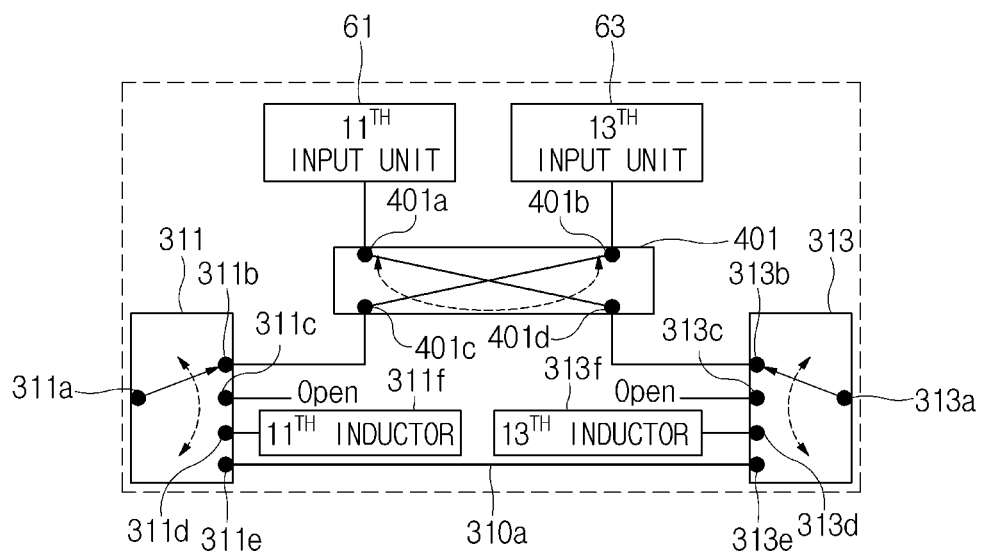
FIG. 26 is a conceptual diagram illustrating a matrix switching unit according to an embodiment of the present invention.

FIG. 25 is a block diagram illustrating a switch matrix assembly including a matrix switching unit according to an embodiment of the present invention. FIG. 26 is a conceptual diagram illustrating a matrix switching unit according to an embodiment of the present invention. As can be seen from FIG. 25, repeated components or some obvious components may be omitted for convenience of description such that a simplified diagram is shown in FIG. 25.

Referring to FIGS. 25 and 26, the switch matrix assembly 70a according to the embodiment may include a plurality of switch matrices (71, 72), a plurality of switching units (311 to 318) connected to any one of the switch matrices (71, 72), and at least one matrix switching unit (40 to 403) configured to interconnect two switching units from among the plurality of switching units (311 to 318).

Referring to FIG. 25, the plurality of switching units (311 to 318) may be connected to the plurality of switch matrices (71, 72), and all or some switching units (311, 313, 315 to 318) from among the plurality of switching units (311 to 318) may be connected to the matrix switching units (401 to 403). If some switching units (311, 313, 315 to 318) are connected to the matrix switching units (401 to 403), some other switching units (312, 314) may not be connected to the matrix switching units (401 to 403). In this case, some other switching units (312, 314) may also be connected to the input units (62, 64). The matrix switching units (301 to 303) may be respectively connected to two input units (61 and 63, 65 and 66). A detailed description thereof will hereinafter be given.

For example, as described above, the plurality of switch matrices (for example, the first switch matrix 71 and the second switch matrix 72) may include not only a plurality of paths through which the electric signal can pass, but also at least one path switching unit. The plurality of paths may be arranged to cross at one or more points, and the path switching units may be arranged at the intersection of the plurality of paths, such that the crossing paths may be electrically connected or may not be electrically disconnected.

The first switch matrix 71 and the second switch matrix 72 may have the same number of first paths. In other words, the number of first paths of the first switch matrix 71 may be identical to the number of first paths of the second switch matrices 72. In addition, the number of second paths of the first switch matrix 71 may also be identical to the number of second paths of the second switch matrix 72.

Of course, according to the embodiment, the number of first paths of the first switch matrix 71 may be different from the number of first paths of the second switch matrices 72, and the number of second paths of the first switch matrix 71 may be different from the number of second paths of the second switch matrix 72. If the number of first paths of the first switch matrix 71 is different from the number of first paths of the second switch matrix 72, any one of the switching units (311 to 318) of the first switch matrix 71 or the second switch matrix 72 may not be connected to the matrix switching units (401 to 403). In addition, assuming that the number of second paths of the first switch matrix 71 is different from the number of second paths of the second switch matrix 72, the first switch matrix 72 and the second switch matrix 72 may be connected to different numbers of output units. Therefore, the number of electric signals generated from the first switch matrix 71 may also be different from the number of electric signals generated from the second switch matrix 72.

At least one of both ends of the first path of each of the first switch matrix 71 and the second switch matrix 72 may include the matrix input unit, and one switching unit (311 to 318) may be connected to each matrix input unit. Therefore, the plurality of switching units (311 to 318) may be present in each of the first switch matrix 71 and the second switch matrix 72.

The plurality of switching units (311 to 318) may be electrically connected to any one of the first switch matrix 71 and the second switch matrix 72. For example, the switching units (311, 312, 315, 317) contained in the same switch matrix (e.g., the first switch matrix 71) from among the plurality of switching units (311 to 318) may be arranged at one or more ends of the first switch matrix 71. If the switching units (311, 312, 315, 317) are arranged at the plurality of ends of the first switch matrix 71, at least one switching unit (e.g., the 11$^{th}$ switching unit 311) from among the plurality of switching units (311, 312, 315, 317) may be arranged to correspond to another switching unit (e.g., the 12$^{th}$ switching unit 312). In accordance with the embodiment, some switching units from among the plurality of switching units (311, 312, 315, 317) may not have the corresponding switching units. The mutually corresponding switching units (e.g., the 11$^{th}$ switching unit 311 and the 12$^{th}$ switching unit 312) may share one first path of the first switch matrix 71.

At least one switching unit (e.g., the 11$^{th}$ switching unit 311 or the 12$^{th}$ switching unit 312) may operate depending on the operation of the corresponding switching unit (e.g., the 12$^{th}$ switching unit 312 or the 11$^{th}$ switching unit 311). The switching units not corresponding to each other (for example, the 11$^{th}$ switching unit 311 and the 15$^{th}$ switching unit) may operate independently of each other.

The plurality of switching units (311 to 318) may connect at least one end of the first path of the first switch matrix 71 or at least one end of the first path of the second switch matrix 72 to a predetermined constituent component. Alternatively, the plurality of switching units (311 to 318) may open at least one end of the first path of the first switch matrix 71 or at least one end of the first path of the second switch matrix 72.

Figure 27:
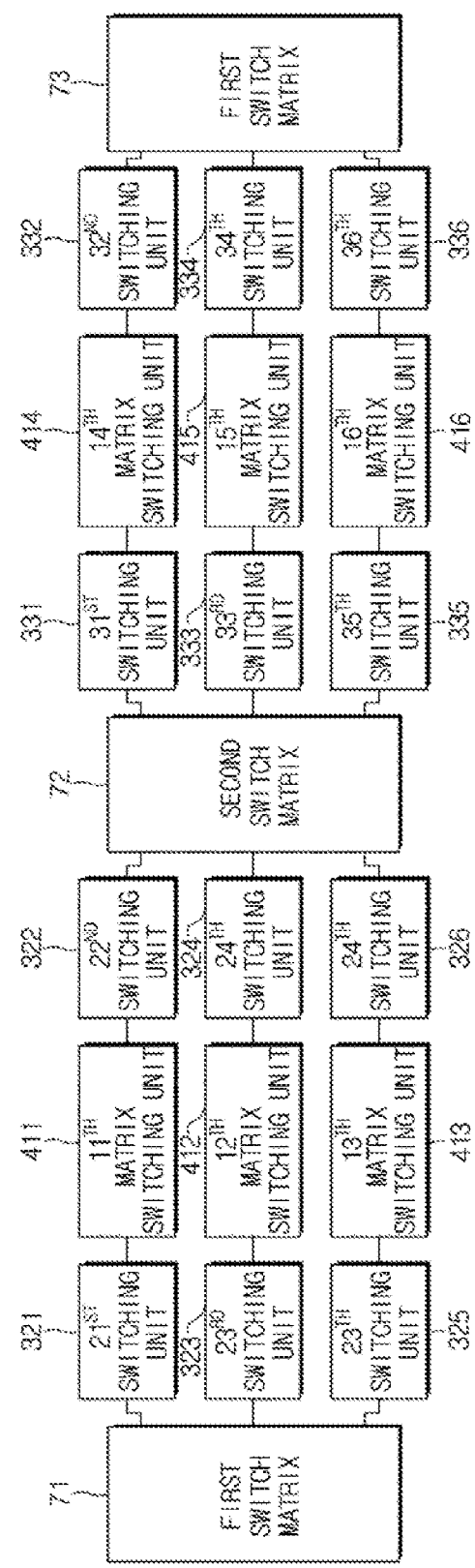
FIG. 27 is a block diagram illustrating a switch matrix assembly including a matrix switching unit according to another embodiment of the present invention.

For example, as can be seen from FIG. 27, any one (i.e., the 11$^{th}$ switching unit 311) of the switching units (311, 312, 315, 317) connected to the first switch matrix 71 may include the 11$^{th}$ matrix connection unit 311a electrically connected to one end of the first path of the first switch matrix 71, the 11$^{th}$ matrix switching unit connection unit 311b electrically connected to the first matrix switching unit 401, and the 11$^{th}$ opening unit 311c indicating an electrically disconnected part formed when the end of the path is severed. In this case, according to the embodiment, the 11$^{th}$ switching unit 311 may include the input unit connection unit (not shown) instead of the 11$^{th}$ matrix switching unit connection unit 311b. In addition, according to another embodiment, the 11$^{th}$ switching unit 311 may further include the 11$^{th}$ inductor connection unit 311d connected to the 11$^{th}$ inductor 311f. In addition, according to another embodiment, the 11$^{th}$ switching unit 311 may further include the 11$^{th}$ storage connection unit (not shown) connected to the 11$^{th}$ resistor (not shown). In addition, according to another embodiment, the 11$^{th}$ switching unit 311 may further include the 11$^{th}$ external switching unit connection unit 311e configured to interconnect the 11$^{th}$ switching unit 311 and a separate switching unit 313.

The 11$^{th}$ matrix connection unit 311a may input the electric signal having passed through the 11$^{th}$ switching unit 311 to the first switch matrix 71, or may output the electric signal generated from the first switch matrix 71 to any one of the 11$^{th}$ matrix switching unit connection unit 311b of the 11$^{th}$ switching unit 40, the 11$^{th}$ opening unit 311c, the 11$^{th}$ inductor connection unit 311d, the 11$^{th}$ resistor connection unit, and the 11$^{th}$ external switching unit connection unit 311e. The 11$^{th}$ matrix connection unit 311a may be implemented using the metal circuit or the end of the conductive line, or may be implemented using a separate port or terminal.

The first matrix switching unit connection unit 311b may interconnect the external first matrix switching unit 401 and the 11$^{th}$ switching unit 311. The 11$^{th}$ matrix switching unit connection unit 311b may be implemented using the metal circuit or the end of the conductive line, or may be implemented using a separate port or terminal.

The 11$^{th}$ input unit connection unit may electrically interconnect the external input unit and the 11$^{th}$ switching unit 311. The 11$^{th}$ input unit connection unit may be used instead of the 11$^{th}$ matrix switching unit connection unit 311b. The 11$^{th}$ input unit connection unit 311b may be implemented using the metal circuit or the end of the conductive line, or may be implemented using a separate port or terminal.

In accordance with the embodiment, the 11$^{th}$ input unit connection unit may be substantially identical to the 11$^{th}$ matrix switching unit connection unit 311b. In other words, assuming that the external input unit instead of the first matrix switching unit 401 is connected to the 11$^{th}$ matrix switching unit connection unit 311b, the 11$^{th}$ matrix switching unit connection unit 311b may serve as the 11$^{th}$ input unit connection unit. In contrast, assuming that the first matrix switching unit 401 is connected to the 11$^{th}$ input unit connection unit, the 11$^{th}$ input unit connection unit may serve as the 11$^{th}$ matrix switching unit connection unit 311b.

The 11$^{th}$ opening unit 311c may denote an electrically disconnected part through which no more current flows. The 11$^{th}$ opening unit 311c is connected to the 11$^{th}$ matrix connection unit 41, such that one end of the 11$^{th}$ switching unit 311 can be opened. Therefore, one end of the first path of the first switch matrix 71 is opened.

The 11$^{th}$ inductor connection unit 311d may electrically interconnect the 11$^{th}$ inductor 311f and the 11$^{th}$ switching unit 311. The 11$^{th}$ switching unit 311 may include only one 11$^{th}$ inductor connection unit 311d, or may include two or more 11$^{th}$ inductor connection units 311d.

As described above, the 11$^{th}$ inductor 311f may generate inductance in the circuit, and may be implemented not only as a metal line formed of copper (Cu) or aluminum (Al) but also as an insulation material contained in the metal line. One end of the 11$^{th}$ inductor 311f may be connected to the 11$^{th}$ inductor connection unit 311d, and the other end of the 11$^{th}$ inductor 311f may be connected to the grounded circuit. If the 11$^{th}$ inductor connection unit 311d is connected to the 11$^{th}$ matrix connection unit 311a, the 11$^{th}$ inductor 311f may be connected to one end of the first path such that capacitance generated from the first path can be compensated for.

In accordance with the embodiment, only one 11$^{th}$ inductor 311f may be contained in the 11$^{th}$ switching unit 311, or two or more 11$^{th}$ inductors 311f may be contained in the 11$^{th}$ switching unit 311. Two or more 11$^{th}$ inductors 311f may be respectively connected to two or more 11$^{th}$ inductor connection units 311d. In this case, two or more 11$^{th}$ inductors 311f may have different inductances.

The 11$^{th}$ resistor connection unit may electrically interconnect the 11$^{th}$ resistor (not shown) and the 11$^{th}$ switching unit 311.

The 11$^{th}$ resistor may be connected to the 11$^{th}$ matrix connection unit 311a according to the operation of the 11$^{th}$ switching unit 311. For example, the 11$^{th}$ resistor may have resistance of 40 to 60 ohm.

The 11$^{th}$ external switching unit connection unit 311e may directly connect any one switching unit (e.g., the 11$^{th}$ switching unit 311) connected to the first switch matrix 71 to any one switching unit (e.g., the 13$^{th}$ switching unit 313) connected to the second switch matrix 72, using a separate conductive line or the circuit 310a. Therefore, the electric signal applied to the 11$^{th}$ switching unit 311 may be transmitted to the 13$^{th}$ switching unit 313 along the conductive line or the circuit 310a. Therefore, the electric signal applied to the first switch matrix 71 may also be applied to the second switch matrix 72. In contrast, the electric signal applied to the 13$^{th}$ switching unit 313 may also be applied to the 11$^{th}$ switching unit 311 along the conductive line or the circuit 310a. Therefore, the electric signal applied to the second switch matrix 72 may also be applied to the first switch matrix 71.

In more detail, for example, the electric signal applied to the 11$^{th}$ input unit 61, the first matrix switching unit 401, the 11th switching unit 311, and the first switch matrix 71 may be applied to the second switch matrix 72 through the 11$^{th}$ external switching unit connection unit 311e, the conductive line or circuit 310a, and the 13$^{th}$ external switching unit connection unit 313e of the 13$^{th}$ switching unit, or may be output through the output unit arranged at the second switch matrix 72. In addition, for example, the electric signal received through the 12$^{th}$ input unit 62, the 12$^{th}$ switching unit 312, and the first switch matrix 71 may be applied to the second switch matrix 72 through the 11$^{th}$ external switching unit connection unit 311e, the conductive line or circuit 310a, and the 13$^{th}$ external switching unit connection unit 313e of the 13$^{th}$ switching unit, and may be output through the output unit arranged in the second switch matrix 72.

The 11$^{th}$ switching unit 311 may selectively connect any one of the 11$^{th}$ matrix switching unit connection unit 311b, the 11$^{th}$ opening unit 311c, the 11$^{th}$ inductor connection unit 311d, the 11$^{th}$ resistor connection unit, and the 11$^{th}$ external switching unit connection unit 311e to the first matrix connection unit 311a. The 11$^{th}$ switching unit 311 may connect any one of the 11$^{th}$ matrix switching unit connection unit 311b, the 11$^{th}$ opening unit 311c, the 11$^{th}$ inductor connection unit 311d, the 11$^{th}$ resistor connection unit, and the 11$^{th}$ external switching unit connection unit 311e to the first matrix connection unit 311a, according to the predefined setting or the control signal received from the external processor.

The 11$^{th}$ matrix switching unit connection unit 311b, the 11$^{th}$ opening unit 311c, the 11$^{th}$ inductor connection unit 311d, the 11$^{th}$ external switching unit connection unit 311e, or the 11$^{th}$ connection unit may also be located in the opposite direction of the matrix connection unit 311a.

In the same manner as described above, the third switching unit 313 may include the 13$^{th}$ matrix connection unit 313a, the 13$^{th}$ matrix switching unit connection unit 313, the 13$^{th}$ opening unit 313c, the 13$^{th}$ inductor connection unit 313d, the 13$^{th}$ external switching unit connection unit 313e, or the 13$^{th}$ resistor connection unit (not shown). In the same manner as described above, the third switching unit 313 may include the 13$^{th}$ input unit connection unit (not shown) instead of the 13$^{th}$ matrix switching unit connection unit 313b. The 13$^{th}$ matrix switching unit connection unit 313b and the 13$^{th}$ input unit connection unit (not shown) may function as the 13$^{th}$ matrix switching unit connection unit 313b or the 13$^{th}$ input unit connection unit according to the connected constituent components, for example, the first matrix switching unit 401 or the input unit 62.

The 11$^{th}$ to 18$^{th}$ switching units (3a to 3f) may be implemented using various switches, for example, the SP2T switch, the SP3T switch, the SP4T switch, the SP5T switch or the SPnT switch (where n is a natural number of 4 or higher).

Referring to FIG. 25, some switching units (311, 313, 315 to 318) from among the plurality of switching units (311 to 318) may be connected to the matrix switching units (401 to 403), some other switching units (312, 314) may be connected to the external input unit (e.g., the first input unit and the 14$^{th}$ input units (62, 64) without using the matrix switching units (401 to 403).

Referring to FIGS. 25 and 26, the matrix switching units (401, 402, 403) may be connected to switching units (311, 313, etc.) from among the plurality of switching units (311, 313, 315 to 318). In addition, the matrix switching units (401, 402, 403) may be connected to the plurality of input units (e.g., the 11$^{th}$ input unit 61 and the 13$^{th}$ input unit 63).

In more detail, as shown in FIG. 26, the first matrix switching unit 401 may include the first matrix switching unit input unit connection unit 401a connected to the 11$^{th}$ input unit 61, the second matrix switching unit input unit connection unit 401b connected to the 13$^{th}$ input unit 63, the first matrix switching unit switching unit connection unit 401c connected to the 11$^{th}$ switching unit 311, and the second matrix switching unit switching unit connection unit 401d connected to the 13$^{th}$ switching unit 313.

Each of the first matrix switching unit input unit connection unit 401a, the second matrix switching unit input unit connection unit 401b, the first matrix switching unit switching unit connection unit 401c, and the second matrix switching unit switching unit connection unit 401d may be implemented using the conductive line, circuit, port, etc.

Any one of the first matrix switching unit input unit connection unit 401a and the second matrix switching unit input unit connection unit 401b may be selectively connected to any one of the first matrix switching unit switching unit connection unit 401c and the second matrix switching unit switching unit connection unit 401d. In this case, assuming that the first matrix switching unit input unit connection unit 401 is connected to the first matrix switching unit switching unit connection unit 401c, the second matrix switching unit input unit connection unit 401b may be connected to the second matrix switching unit switching unit connection unit 401d. In contrast, assuming that the first matrix switching unit input unit connection unit 401 is connected to the second matrix switching unit switching unit connection unit 401d, the second matrix switching unit input unit connection unit 401b may be connected to the first matrix switching unit switching unit connection unit 401c.

Therefore, the electric signal generated from the 11$^{th}$ input unit 61 may be transmitted to the 11$^{th}$ switching unit 311 through the first matrix switching unit input unit connection unit 401a and the first matrix switching unit switching unit connection unit 401c, or may be transmitted to the 13$^{th}$ switching unit 313 through the first matrix switching unit input unit connection unit 401a and the second matrix switching unit switching unit connection unit 401d. In contrast, the signal generated from the 12$^{th}$ input unit 62 may be transmitted to the 11$^{th}$ switching unit 311 through the second matrix switching unit input unit connection unit 401b and the first matrix switching unit switching unit connection unit 401c, or may be transmitted to the 13$^{th}$ switching unit 313 through the second matrix switching unit input unit connection unit 401b and the second matrix switching unit switching unit connection unit 401d.

In conclusion, the electric signal generated from the 11$^{th}$ input unit 61 or the electric signal generated from the 12$^{th}$ input unit 62 may be transmitted to any one of the first switch matrix 71 and the second switch matrix 72 by the first matrix switching unit 401.

The first matrix switching unit 401 may operate according to the predefined setting or the control signal received from the processor, such that the electric signal generated from the respective input units (61, 62) may be transmitted to any one of the first switch matrix 71 and the second switch matrix 72.

In the same manner as in the 11$^{th}$ matrix switching unit 401, the second matrix switching unit 402 or the third matrix switching unit 403 may selectively transmit the plurality of electric signals received from the plurality of input units (65, 66) to any one of the plurality of switch matrices (71, 72).

The matrix switching units (401 to 403) may be implemented using a Double-Pole-Double-Throw (DPDT) switch, and may also be implemented using various kinds of switches or associated components.

If the switch matrix assembly 70a further includes the matrix switching units (401 to 403), the path through which the electric signal flows without increasing or extending the switch matrices (71, 72) can be further diversified. For example, assuming that each switch matrix (71, 72) has the (12×12) structure, i.e., assuming that 12 first paths and 12 second paths are present in the respective switch matrices (71, 72), the resultant structure may have the same performance as the switch matrix assembly including one (48×24) switch matrix. Therefore, the number of path switching units contained in each switch matrix can be effectively reduced. In other words, in the case of using one switch matrix having the (48×24) structure, 1152 path switching units are needed, however, the switch matrix assembly 70a further including the matrix switching units (401 to 403) requires a total of 288 (=2*12*12) path switching units such that the number of path switching units can be greatly reduced.

FIG. 27 is a block diagram illustrating a switch matrix assembly including a matrix switching unit according to another embodiment of the present invention.

Referring to FIG. 27, the switch matrix assembly 70b may include at least three switch matrices (71 to 73); a plurality of switching units (321 to 326, 331 to 336) connected to any one of the at least three switch matrices (71 to 73); and at least one matrix switching unit (411 to 416) configured to interconnect two switching units from among the plurality of switching units (321 to 326, 331 to 336).

In more detail, the first switch matrix 71 from among the plurality of switch matrices may include the 21$^{th}$ switching unit 321, the 23$^{rd}$ switching unit 323, and the 25$^{th}$ switching unit 325. The second switch matrix 72 may include the 22$^{nd}$ switching unit 322, the 24$^{th}$ switching unit 324, the 26$^{th}$ switching unit 326, the 31$^{st}$ switching unit 331, the 33$_{rd}$ switching unit 333, and the 35$^{th}$ switching unit 335. The third switch matrix 72 may include the 32$^{nd}$ switching unit 332, the 34$^{th}$ switching unit 334, and the 36$^{th}$ switching unit 336. In this case, any one of some switching units (322, 324, 326) from among the plurality of switching units (322, 324, 326, 331, 333, 335) connected to the second switch matrix 72 may correspond to any one of some other switching units (331, 333, 335).

For convenience of description, as can be seen from FIG. 27, three switching units (321, 323, 325) are connected to the first switch matrix 71, and three switching units (332, 334, 336) are connected to the third switch matrix 73. Although the switch matrix assembly 70b including 6 switching units (322, 324, 326, 331, 333, 335) may be connected to the second switch matrix 72, four or more switch matrices may be used, and each switch matrix may further include other switching units as necessary.

The plurality of switch matrices, for example, each of the first to third matrices (71 to 73) may include a plurality of paths through which the electric signal can be transmitted, and at least one path switching unit. In this case, the plurality of paths may be arranged to cross at one or more points, and the path switching unit may be disposed at the intersection of the plurality of paths. The path switching unit may electrically interconnect the plurality of crossing paths, or may electrically disconnect the crossing paths from one another.

The first to third switch matrices (71 to 73) may include the same number of first paths, or may include different numbers of first paths. Assuming that the number of first paths of the first switch matrix 71, the number of second paths of the second switch matrix 72, and the number of first paths of the third switch matrix 73 are different from each other, any one of the switching units (321 to 326, 331 to 336) respectively installed in the first to third switch matrices (71 to 73) may not be connected to the matrix switching units (411 to 416).

In addition, the first to third switch matrices (71 to 73) may have the same number of second paths, or may have different numbers of second paths. In this case, the number of output units connected to the first switch matrix 71, the number of output units connected to the second switch matrix 72, and the number of output units connected to the third switch matrix 73 may be different from each other, such that the number of electric signals generated from the first switch matrix 71, the number of electric signals generated from the second switch matrix 72, and the number of electric signals generated from the third switch matrix 73 may also be different from each other.

As described above, the matrix input unit may be connected to one end of at least one of the first path of the first switch matrix 71, the first path of the second switch matrix 72, and the first path of the third switch matrix 73, and at least one switching unit (321 to 326, 331 to 336) may be installed in each matrix input unit such that the switching units can be electrically interconnected.

The plurality of switching units (321 to 326, 331 to 336) may be electrically connected to any one of the first to third switch matrices (71 to 73).

All or some of the switching units (321 to 326, 331 to 336) may further be electrically connected to the matrix switching units (411 to 416).

As described above, the respective switching units (321 to 326, 331 to 336) may include a matrix connection unit electrically connected to one end of the first path of the switch matrices (71 to 73); a matrix switching unit connection unit electrically connected to the matrix switching units (411 to 416); and an opening unit indicating an electrically disconnected part formed when the end of the path is severed. In accordance with the embodiment, the respective switching units (321 to 326, 331 to 336) may further include the inductor connection unit or the resistor connection unit as described above. In addition, the respective switching units (321 to 326, 331 to 336) may further include an external switching unit as necessary. The electric signal applied to the first switch matrix 71 through the external switching unit connection unit may be applied to the second switch matrix 71. In addition, the electric signal applied to the second switch matrix 72 may be applied to the third switch matrix 73. In the same manner, the electric signal applied to the first switch matrix 72 may also be applied to the third switch matrix 73 through the second switch matrix 72. In addition, the respective switching units (321 to 326, 331 to 336) may further include the input unit connection unit instead of the matrix switching unit connection unit, or may further include the input unit connection unit in addition to the matrix switching unit connection unit.

The matrix connection unit, the matrix switching unit connection unit, the opening unit, the inductor connection unit, the resistor connection unit, and the external switching unit connection unit have already been disclosed above, and as such a detailed description thereof will herein be omitted for convenience of description.

The respective switching units (321 to 326, 331 to 336) may electrically connect any one of the matrix switching connection unit, the opening unit, the inductor connection unit, the resistor connection unit, and the external switching unit connection unit to the matrix connection unit according to the predefined setting or the control signal received from the external processor. Therefore, the first path of the switch matrices (71 to 73) in which the respective switching units (321 to 326, 331 to 336) are installed may be connected to the matrix switching units (411 to 416), one end of the first path may be opened, and the first path may be connected to the inductor or resistor or may be electrically connected to the first path of other switch matrices (71 to 73).

The matrix switching units (411 to 416) may be respectively connected to the plurality of input units (not shown), and the electric signals generated from the plurality of input units may be selectively transmitted to any one of the switching units (321 to 326, 331 to 336) connected to the matrix switching units (411 to 416). In this case, some matrix switching units (411 to 413) from among the matrix switching units (411 to 416) may transmit the electric signal acquired from a predetermined input unit to any one of the first switch matrix 71 and the second switch matrix 72, and some other matrix switching units (414 to 416) may transmit the electric signal obtained from the other input unit to the second switch matrix 72 and the third switch matrix 73. Therefore, the electric signals generated from at least four different input units may be applied to the second switch matrix 72. Therefore, it may be possible to obtain a transmission path of four or more electric signals using only one switch matrix 72.

As described above, the electric signals generated from the plurality of input units may be applied to any one of the first to third switch matrices (71 to 73), and the electric signal applied to any one switch matrix may be output externally through the output unit contained in any one switch matrix.

The matrix switching units (411 to 416) may operate according to the predefined setting or the control signal received from the external processor.

The magnetic resonance imaging (MRI) apparatus using the switch matrix assembly according to the embodiment will hereinafter be described with reference to FIGS. 28 to 33.

Figure 28:
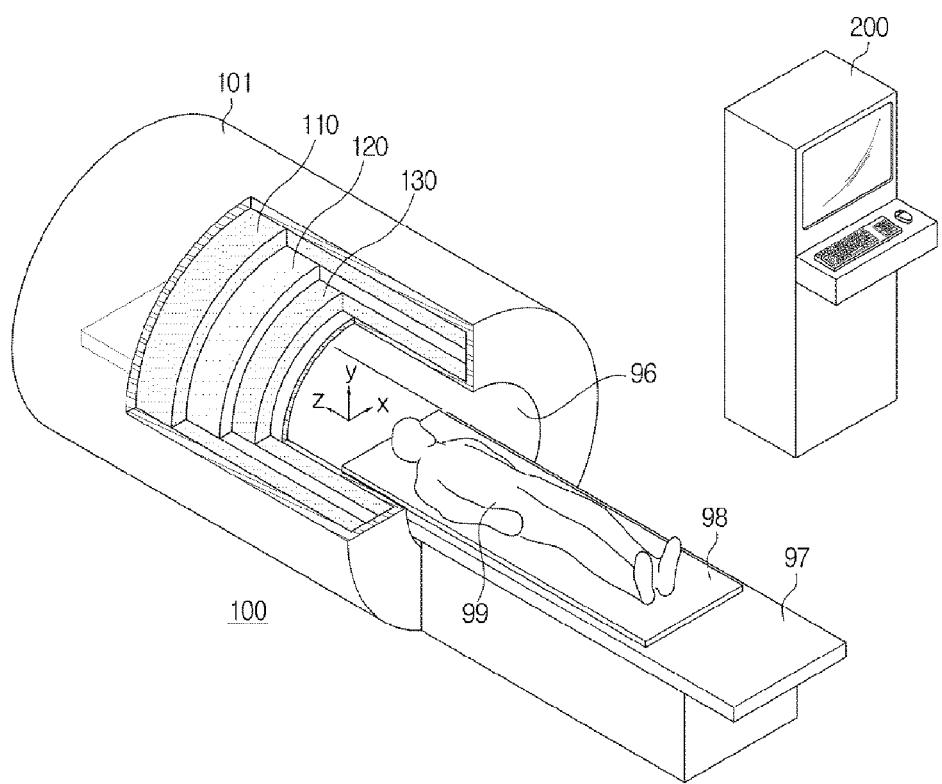
FIG. 28 is a conceptual diagram illustrating a magnetic resonance imaging (MRI) apparatus according to an embodiment of the present invention.
Figure 29:
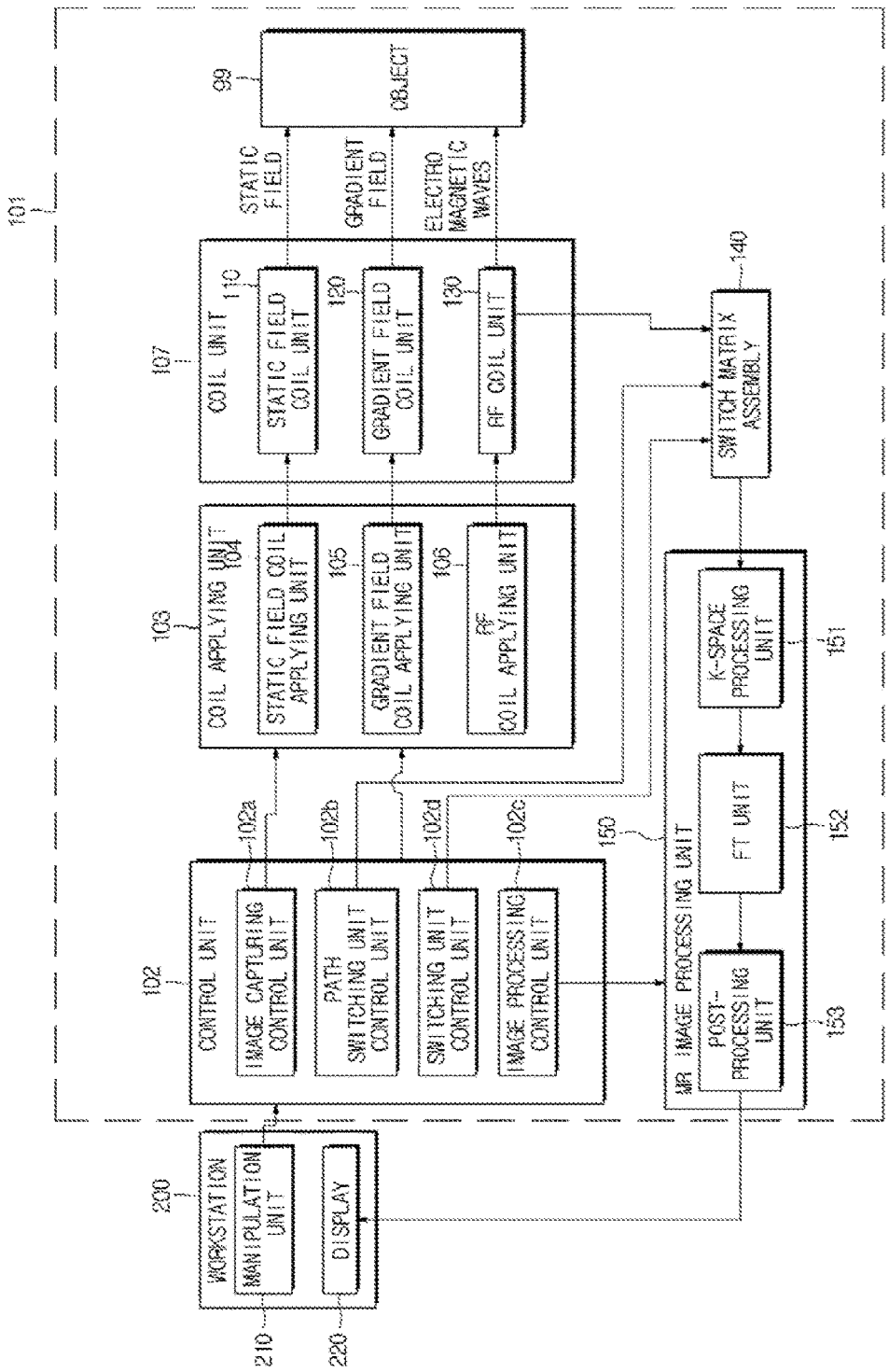
FIG. 29 is a block diagram illustrating a magnetic resonance imaging (MRI) apparatus according to an embodiment of the present invention.
Figure 30:
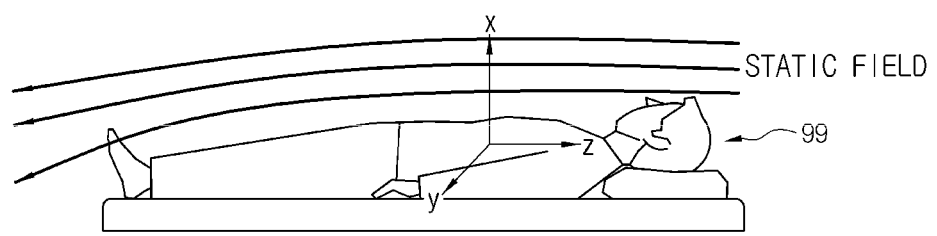
FIG. 30 is a conceptual diagram illustrating the operations of a static field coil unit according to an embodiment of the present invention.
Figure 31:
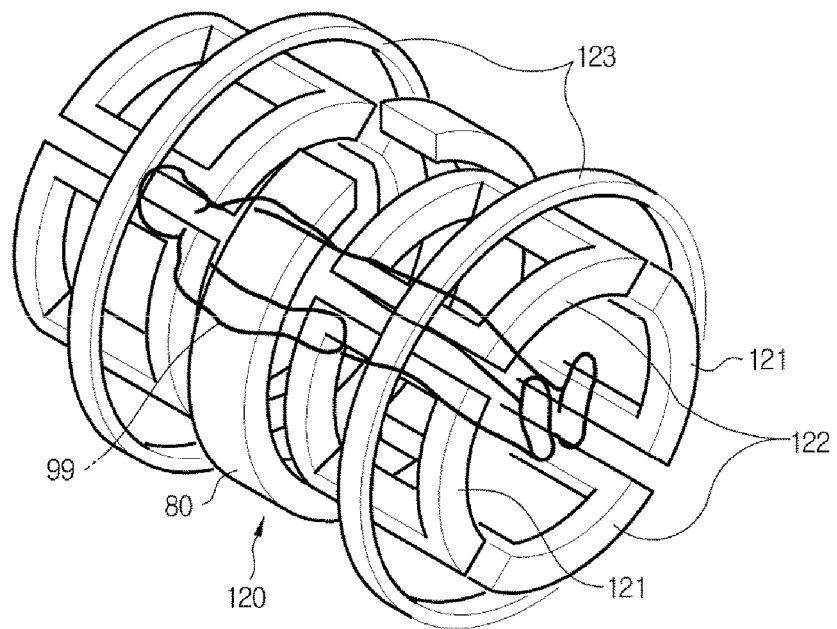
FIG. 31 is a conceptual diagram illustrating the operations of a gradient field coil unit according to an embodiment of the present invention.
Figure 32:
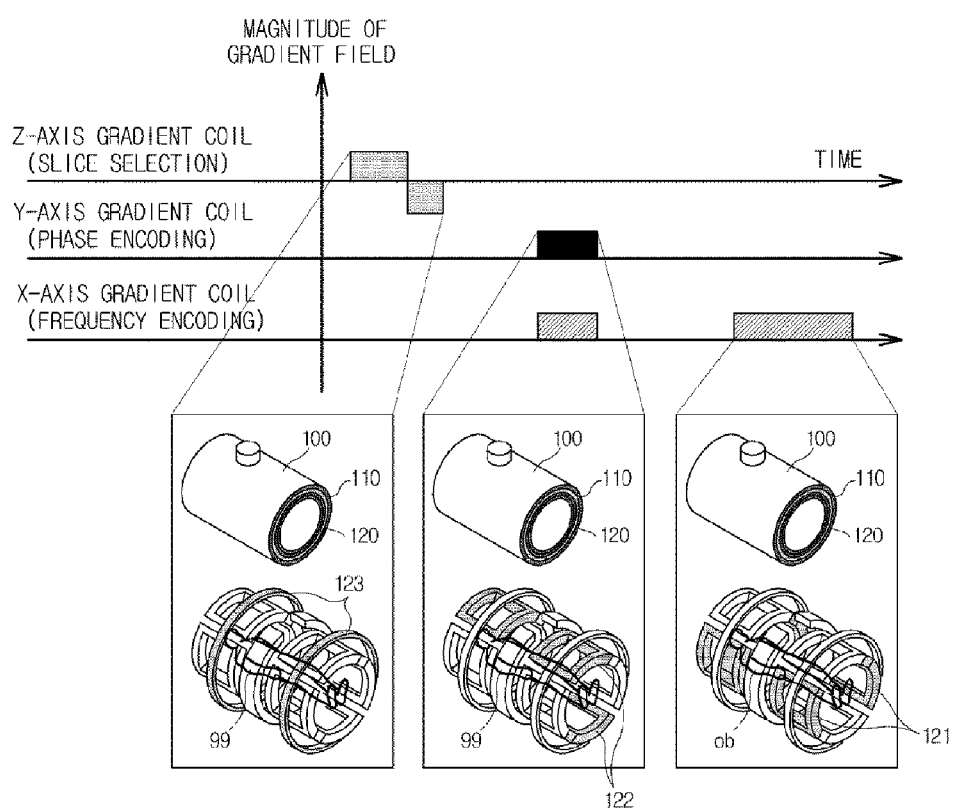
FIG. 32 is a conceptual diagram illustrating the operations of a gradient field coil unit according to another embodiment of the present invention.
Figure 33:
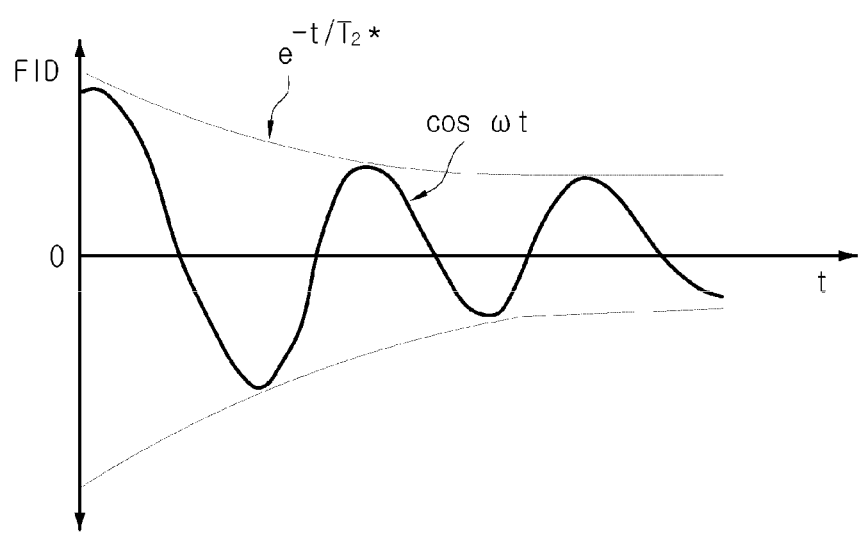
FIG. 33 is a conceptual diagram illustrating the acquired free induction decay (FID) signal according to an embodiment of the present invention

FIG. 28 is a conceptual diagram illustrating a magnetic resonance imaging (MRI) apparatus according to an embodiment of the present invention. FIG. 29 is a block diagram illustrating a magnetic resonance imaging (MRI) apparatus according to an embodiment of the present invention. FIG. 30 is a conceptual diagram illustrating the operations of a static field coil unit according to an embodiment of the present invention. FIG. 31 is a conceptual diagram illustrating the operations of a gradient field coil unit according to an embodiment of the present invention. FIG. 32 is a conceptual diagram illustrating the operations of a gradient field coil unit according to another embodiment of the present invention. FIG. 33 is a conceptual diagram illustrating the acquired free induction decay (FID) signal according to an embodiment of the present invention.

Referring to FIGS. 28 and 29, the magnetic resonance imaging (MRI) apparatus 100 may include a main body 101 in which a bore 96 indicating an empty inner space is formed; and a workstation 200 connected to the main body 101.

The main body 101 may include a transfer unit 98 to transport an object from the outside to the inside of the bore 96, and to transport the object from the inside to the outside of the bore 96; and a support 97 in which the transfer unit 98 is disposed over the top surface of the support 97. Various devices configured to move the transfer unit 98 may be installed in the transfer unit 98 and the support 97. For example, components (e.g., wheels, rails, or sawteeth) may be installed in at least one of the transfer unit 98 and the support 97. For example, the object 99 (e.g., a human body) may be disposed over the transfer unit 98 and then transferred to the inside of the bore 96. Various devices to obtain the magnetic resonance (MR) image may be installed in the main body 101. For example, as shown in FIG. 29, a coil unit 107 configured to apply the magnetic field or the RF pulse to the object 99 may be installed in the main body 101.

Referring to FIG. 29, the main body 101 of the MRI apparatus 100 may include a control unit 102, a coil applying unit 103, a coil unit 107, a switch assembly 140, and a magnetic resonance (MR) image processing unit 150. In accordance with the embodiment, the main body 101 of the magnetic resonance imaging (MRI) apparatus 100 may include many more components, however, a detailed description thereof will herein be omitted for convenience of description.

The control unit 102, the coil applying unit 103, and the magnetic resonance (MR) image processing unit 150 may be physically or logically separated from one another. In accordance with the embodiment, the control unit 102, the coil applying unit 103, and the magnetic resonance (MR) image processing unit 150 may be implemented by different processors, or may be implemented by one processor. The processor may be implemented as one or more semiconductor chips or associated components.

The control unit 102 may generate a control signal, and may transmit the generated control signal to the constituent components of the magnetic resonance imaging (MRI) apparatus 100, such that the overall operations of the magnetic resonance imaging (MRI) apparatus 100 can be controlled. As shown in FIG. 28, the control unit 102 may be implemented by a processor installed in the main body 101 of the magnetic resonance imaging (MRI) apparatus 100, or may be implemented by the processor installed in the workstation 200. The control unit 102 may transmit the control signal to at least one of the coil applying unit 103, the switching assembly 140, and the MR image processing unit 150 according to the electric signal received from the manipulation unit 210 of the workstation 200.

The control unit 102 may include an image capturing control unit 102a, a path switching unit control unit 102b, a switching unit control unit 102c, and an image processing control unit 102d.

The image capturing control unit 102a may capture an image of the object 99 by controlling the coil applying unit 103. The image capturing control unit 102a may generate a control signal according to the predefined setting or the electric signal received from the manipulation unit 210, and may transmit the generated control signal to the coil applying unit 103.

The path switching unit control unit 102b may control the path switching unit of the switching assembly 140. The path switching unit control unit 102b may generate a control signal according to the predefined setting or the electric signal received from the manipulation unit 210, and may then transmit the generated control signal to the switching assembly 140. The path switching unit of the switching assembly 140 may operate according to the control signal. The path switching unit may interconnect at least one first path and at least one second path according to the control signal, or may disconnect the at least one first path and the at least one second path from each other.

The switching unit control unit 102c may control at least one of the switching unit and the matrix switching unit of the switching assembly 140. The switching unit control unit 102c may generate a control signal according to the predefined setting or the electric signal received from the manipulation unit 210, and may transmit the generated control signal to the switching assembly 140. At least one of the switching unit and the matrix switching unit of the switching assembly 140 may operate according to the control signal.

The image processing control unit 102d may control the MR image processing unit 150. The image processing control unit 102d may generate the control signal according to the predefined setting or the electric signal received from the manipulation unit 210, and may transmit the generated control signal to the MR image processing unit 150. The MR image processing unit 150 may generate the MR image according to the control signal.

The image capturing control unit 102a, the path switching unit control unit 102b, the switching unit control unit 102c, and the image processing control unit 102d may be implemented by one or more processors, or may respectively be implemented by different processors according to the embodiments of the present invention.

The coil applying unit 103 may apply a current signal to the coil unit 107 according to the control signal, such that the coil unit 107 may form the magnetic field or the free induction decay (FID) signal or may obtain the free induction decay (FID) signal. The coil applying unit 103 may include a static field coil applying unit 104, a gradient field coil applying unit 105, and an RF coil applying unit 106. The static field coil applying unit 104, the gradient field coil applying unit 105, and the RF coil applying unit 106 may be arranged to respectively correspond to the static field coil unit 110, the gradient field coil unit 120, and the RF coil unit 130. Upon receiving the current signal from the static field coil applying unit 104, the gradient field coil applying unit 105, or the RF coil applying unit 106 of the coil applying unit 103, the static field coil unit 110, the gradient field coil unit 120, and the RF coil unit 130 may generate a static field, a gradient magnetic field, and an RF pulse, respectively.

The coil unit 107 may form a magnetic field not only in the object 99 transferred to the inside of the bore 96, but also in the vicinity of the object 9, and may apply RF pulses to the object 99, such that the magnetic resonance (MR) phenomenon may occur in the object 99. In addition, the coil unit 107 may collect the FID signals generated by the MR phenomenon such that the coil unit 107 can collect information regarding internal cross-sectional images of the object 99. In this case, the coil unit 107 may collect the FID signals from the object 99 using the nuclear magnetic resonance (NMR) phenomenon indicating that the nucleus of a hydrogen atom within the object 99 is resonated by RF pulses having a predetermined frequency.

The magnetic resonance (MR) phenomenon will hereinafter be described in detail.

Atomic nuclei of elements of hydrogen (H), phosphorous (P), sodium (Na) or various carbon isotopes (C) at the inside of a target object, for example, a human body, have spins. Therefore, if atomic nuclei are exposed to an external magnetic field, and are thus magnetized, spins of the atomic nuclei are arranged in the direction of the magnetic field and are rapidly rotated at a designated angle to a central axis by torque received from the magnetic field, and such a phenomenon is referred to as precession. A frequency of precession of the nuclei spinning is referred to as a Larmor frequency. Such a Larmor frequency may be changed according to the intensity of the external magnetic field and the categories of atomic nuclei. When RF pulses of a frequency equal to or similar to the Larmor frequency are applied to the above-described atomic nuclei, a magnetization vector of the atomic nuclei resonates and is thus oriented orthogonal to the received magnetic field. At this time, the magnetization vector induces a voltage signal, generally referred to as the FID signal, on neighboring high-frequency coils. In this case, the magnetization vector may induce a voltage signal called the induction decay (FID) signal to the neighboring high-frequency coils, and this phenomenon is referred to as nuclear magnetic resonance (NMR).

The coil unit 107 may apply the magnetic field to the object 99, and may receive the FID signal (i.e., the magnetic resonance signal) from the object 99, so that it may acquire information regarding the target portion contained in the object.

In accordance with the embodiment, the coil unit 107 may include a static field coil unit 110, a gradient field coil unit 120, and a radio frequency (RF) coil unit 130. The static field coil unit 110, the gradient field coil unit 120, and the RF coil unit 130 may be embedded in the main body 101. In accordance with the embodiment, the RF coil unit 130 may not be embedded in the main body 101. In this case, the RF coil unit 130 may be mounted or attached to the object 99 or the like, or may be transferred to the inside of the bore 96 along with the object 99.

The static field coil unit 110 may generate a predetermined static magnetic field in the bore 96. The static magnetic field may magnetize the nuclei of some atoms (e.g., hydrogen (H), phosphorous (P), sodium (Na), etc.) causing the magnetic resonance (MR) phenomenon, from among atoms distributed in the human body. In this case, the static magnetic field may be generated parallel to the shaft of the bore 96 of the MRI apparatus. Referring to FIGS. 28 and 30, assuming that a component arranged parallel to the movement direction of the transfer unit 98 is referred to as a Z-axis, a component orthogonal to the Z axis and parallel to the ground is referred to as the X-axis, and a component orthogonal to the Z axis and perpendicular to the ground is referred to as the Y-axis, the static magnetic field may be generated along the Z-axis direction. Assuming that the object 99 is a human body, a static magnetic field may be created from the head of the human body toward the legs. The above-mentioned Larmor frequency may be proportional to the intensity of a static magnetic field formed in the object 99.

The static field coil unit 110 may be formed of permanent magnets or superconductive electromagnets. In order to generate a magnetic field having a high magnetic flux of about 0.5 Tesla (T), a superconductive electromagnet may be used. When the nucleus of an atom such as hydrogen, phosphorus and sodium is exposed to a static magnetic field, it is magnetized, and the magnetization vector of the nucleus precesses around the static magnetic field.

The gradient field coil unit 120 may produce spatially linear gradient fields (Gx, Gy, Gz) in the object 99 in the bore 96 to change uniformity of the magnetic field. Thereby, when the magnetization vector of the nucleus of an atom such as hydrogen, phosphorus and sodium produced by a static magnetic field rotates in a transverse plane, the rotation frequency and phase of the magnetization vector can be spatially controlled such that a magnetic resonance imaging signal is depicted in the k-space (i.e., the spatial frequency domain.)

Referring to FIGS. 31 and 32, the gradient field coil unit 120 may include three gradient coils (121 to 123) to create gradient magnetic fields in the X-axis, Y-axis or Z-axis directions to capture a magnetic resonance image. The gradient coils (121 to 123) may produce gradient magnetic fields (Gx, Gy, Gz) having different gradients in different directions.

The X-axis gradient coil 123 may produce a frequency-encoding gradient (Gx) in the X-axis direction which allows spins in respective rows to have different frequencies such that the spins are distinguishable from each other. The y-axis gradient coil 122 may produce a phase-encoding gradient in the Y-axis direction to cause phase shift such that rows of the slice have different phases for phase encoding. The Z-axis gradient coil 121 may produce a slice-select gradient (Gz) in the Z-axis direction which is used for selection of a slice.

FIG. 31 illustrates a view illustrating pulse sequences of the respective gradient coils. Referring to FIG. 31, the Z-axis gradient coil 121 may create the gradient field (Gz) in the Z-axis direction such that for a human body provided as the object 99, the strength of the magnetic field decreases from the head to the legs to form a magnetic field having a predetermined gradient in the Z-axis direction. In this case, the RF coil unit 130 transmits RF pulses having one frequency, free induction decay (FID) signals are generated from slices subjected to the magnetic field within the frequency range of the transmitted RF pulses to allow selection of one or more slices. At this time, all the spins of a selected slice have the same frequency and same phase and are thus indistinguishable from each other.

The Y-axis gradient coil 122 may create a phase-encoding gradient (Gy) in the Y-axis direction. Different phase shifts may be subjected to the spins of each slice according to the phase-encoding gradient. In other words, when the Y-axis gradient is created, the phase of the spins with higher gradient may change to higher frequency, and the phase of the spins with lower gradient may change to a lower frequency. When the Y-axis gradient is interrupted, all the spins may precess at a predetermined frequency. However, permanent phase shift may be caused by the Y-axis gradient, and therefore the spins may become distinguishable from each other. This operation is referred to as phase encoding.

During acquisition of free induction decay (FID) signals, the X-axis gradient coil 123 may apply the frequency encoding gradient (Gx) to the object 99 in the X-axis direction. In the case that the slices are expressed in a predetermined matrix, the X-axis directional frequency encoding gradient (Gx) may allow the spins from different rows to have different frequencies such that the spins are distinguished from each other. This operation is referred to as frequency encoding.

The RF coil unit 130 may apply an RF signal to the object 99, or may receive the FID signal from the object 99. In accordance with the embodiment, the RF coil unit 130 may include a plurality of coil elements to apply the RF signal to the object 99 or to receive the FID signal from the object 99.

The plurality of coil elements may independently or simultaneously apply the RF pulses to the object 99, or may receive the FID signal. In addition, the plurality of coil elements may also be designed to apply the RF pulses to the object 99 in both of the independent and simultaneous manners as necessary.

For example, the coil element may have a loop structure. In more detail, the coil element may have a loop structure formed in a circular shape, oval shape, quadrangular shape, or a hexagonal shape. Besides, the coil element may also be implemented in various shapes capable of being used by the designer.

In accordance with the embodiment, the coil element may include reception (Rx) coils to receive the FID signal from the object 99. In accordance with another embodiment, the coil element may also include transmission and reception (Tx/Rx) coils to apply the RF signal to the object 99 as well as to receive the FID signal from the object 99.

The RF coil unit 130 may include a plurality of coil elements, for example, first to fourth coil elements. The coil elements can respectively output the electric signals, such that the RF coil unit 130 can output electric signals through a plurality of channels. The electric signal generated from the respective coil elements may be applied to another component, for example, the switch matrix.

In accordance with the embodiment, the first to fourth coil elements may be electrically connected to the first to fourth switching units contained in the switch matrix assembly 140, respectively. In other words, the first electric signal generated from the first coil element may be applied to the first switching unit, and the second electric signal generated from the second coil element may be applied to the second switching unit.

In addition, according to the embodiment, the first to fourth coil elements may be electrically connected to the above-mentioned matrix switching unit. In this case, two coil elements may be electrically connected to one matrix switching unit. For example, the first and second coil elements may be connected by the matrix switching unit, and the first and second coil elements may be selectively and respectively connected to any one of the first switch matrix and the second switch matrix according to the operation of the matrix switching unit.

When the static field and the gradient field are applied to the object 99, the transmission (Tx) coil or the Tx/Rx coils of the RF coil unit 130 may apply RF pulses to the target part of the object 99. If the RF coil 130 applies RF pulses to the target part, the nucleus of the atom may perform precession according to a new magnetic component of the RF pulses. In other words, a traverse magnetization vector may occur in the nucleus of the atom. If RF pulses having the same frequency are applied to the nucleus of the atom that precesses at a predetermined frequency, the magnetic resonance (MR) phenomenon occurs in the target part. As the magnetization vector rotates (or spins), a predetermined electromotive force (EMF) is induced in the Rx or Tx/Rx coil or the RF coil unit 130 of the RF coil unit 130. The predetermined EMF is a free induction decay (FID) signal, such that the RF coil unit 180 may receive the FID signal from the object 99.

Referring to FIG. 33, the FID signal may be formed in waves gradually reduced according to lapse of time. In this case, damping of the waves is achieved according to the equation (e−t/T2*), and may oscillate in response to the value of cos ωt. The amplitude of the FID signal may be gradually reduced according to a dephasing of the atomic nucleus. In the meantime, if RF pulse applying stops, the traverse magnetization vector may decay at a predetermined speed (i.e., T2 decay). In this case, the delay speed may be based on a time constant (T2). The value of (T2*) for use in the FID damping may be determined in consideration of the T2 decay and the dephasing caused by a non-uniform magnetic field. Therefore, the damping speed (T2*) of the FID signal may be faster than the T2 decay speed.

The signal obtained from the RF coil unit 130 may be transmitted to the switch matrix assembly 140.

As described above, the switch matrix assembly 140 may include at least one switch matrix, a plurality of switching units installed at the plurality of end parts of at least one switch matrix, and an output unit configured to output the electric signal (i.e., the FID signal) having passed through the switch matrix. The switch matrix may include a first path through which the electric signal can be transmitted; a second path formed to cross the first path such that the electric signal can be transmitted there through; and a path switching unit located at the intersection of the first path and the second path, so as to electrically interconnect the first path and the second path according to a control signal of the path switching unit control unit 102b or to disconnect electrical connection between the first path and the second path. The switching units may be respectively disposed at both ends of the first path. The plurality of switch matrices may be used. In this case, the switch matrix assembly may further include a matrix switching unit.

The switching unit may be electrically connected to the RF coil unit 130. In more detail, the switching unit may be electrically connected to each coil element of the RF coil unit 130 through the circuit or the conductive line. In accordance with the embodiment, the switching unit may be connected to the RF coil unit 130 through a wireless network. In this case, the magnetic resonance imaging (MRI) apparatus 100 may further include a wireless communication module to form a wireless network. An amplifier or analog-to-digital converter (ADC) may further be disposed between the switching unit and the RF coil unit 130.

The switching unit may connect the RF coil unit 130 to one end of the first path according to a control signal of the switching unit control unit 102c, or may open one end of the first path. If the first end of the first path is connected to the RF coil unit 130 by the first switching unit, the second end of the first path may be opened by the second switching unit.

The switching unit may connect the first inductor to one end of the first path according to a control signal of the switching unit control unit 102c, may connect the first resistor to one end of the first path, or may connect the switching unit disposed in another switch matrix to the one end of the first path. If the second end of the first path is connected to the second coil unit by the second switching unit, the first end of the first path may be selectively connected to the first inductor by the first switching unit. In contrast, if the first end of the first path is connected to the first coil element by the first switching unit, the second end of the first path may be selectively connected to the second inductor by the second switching unit. If the first inductor or the second inductor is connected to the first end or the second end of the first path, capacitance generated in the residual part of the first path can be compensated for, such that insertion loss of the transmitted FID signal can be reduced.

The matrix switching unit may be electrically connected to the RF coil unit 130. The matrix switching unit may connect the plurality of coil elements (e.g., first to fourth coil elements) of the RF coil unit 130 to the plurality of switching units (e.g., first to fourth switching units), and any one of the plurality of coil elements may be selectively transmitted to any one of the plurality of switching units. The FID signal transmitted to the matrix switching unit may be selectively transmitted to any one of the plurality of switch matrices.

In accordance with the embodiment, some coil elements from among the plurality of coil elements of the RF coil unit 130 may be connected to the matrix switching unit, and some other coil elements may be connected to the switching unit without passing through the matrix switching unit. For example, the first switching unit disposed in the first switch matrix and the second switching unit disposed in the second switch matrix may be connected to the matrix switching unit. The first switching unit or the second switching unit may be designed to receive the FID signal from the first coil element or the second coil element according to the operation of the matrix switching unit. In contrast, the third switching unit disposed in the first switch matrix and the fourth switching unit disposed in the second switch matrix may be connected to the third coil element and the fourth coil element without passing through the matrix switching unit, the third switching unit may receive the FID signal from the third coil element, and the fourth switching unit may receive the FID signal from the fourth coil element. In this case, the third switching unit may be arranged to correspond to the first switching unit, and the fourth switching unit may be arranged to correspond to the second switching unit. In this case, the first switching unit and the third switching unit may interact with each other, and the second switching unit and the fourth switching unit may interact with each other.

In accordance with the embodiment, at least one of the amplifier (not shown) and the ADC (not shown) may be disposed in the main body 101.

The amplifier may amplify the FID signal. In this case, the FID signal may be an analog signal or a digital signal. The amplifier may be disposed between the switch assembly 140 and the RF coil unit 130, or may be disposed between the switch assembly 140 and the MR image processing unit 150.

The ADC may convert the analog FID signal into the digital FID signal by sampling the FID signal according to a predetermined sampling rate. The ADC may be disposed between the switch assembly 140 and the RF coil unit 130, or may be disposed between the switch assembly 140 and the MR image processing unit 150.

The MR image processing unit 150 may receive the FID signal from the switch matrix assembly 140, the amplifier, or the ADC, may generate the k-space using the received FID signal, and may generate the MR image using the generated k-space.

In more detail, as shown in FIG. 29, the MR image processing unit 150 may include the k-space processing unit 151 to generate the k-space; a Fourier Transform (FT) unit 152 to perform Fourier transform of the k-space; and a post-processing unit 153 to perform post-processing of the obtained MR image according to the Fourier transform.

The k-space processing unit 151 may generate the k-space on the basis of the received FID signal. In more detail, the k-space processing unit 151 may acquire the k-space data from the FID signal, may arrange the acquired k-space data according to the predefined setting, and may thus generate the k-space. As described above, the amplitude of the FID signal is reduced by dephasing or the like. Accordingly, if a signal is arranged in the data space, the FID signal may have the largest amplitude in the center region of the data space. Therefore, generally, the signal may have the highest strength in the center region of the k-space. The generated k-space may be transmitted to the Fourier Transform (FT) unit 152.

The FT unit 152 may convert the k-space generated by the k-space processing unit 151 using the Fourier Transform, such that it can obtain the magnetic resonance (MR) corresponding to the k-space.

The post-processing unit 153 may adjust brightness, sharpness, and/or contrast of all or some parts of the MR image obtained from the FT unit 152 so as to correct the MR image. In accordance with the embodiment, the post-processing unit 153 may also generate a three-dimensional (3D) image using the plurality of MR images. The post-processing unit 153 may be omitted according to the embodiments for convenience of description. The MR image obtained from the MR image processing unit may be displayed on the display unit 220 of the workstation 200.

The workstation 200 may control the magnetic resonance imaging (MRI) apparatus 100, may receive various user commands needed to control the MRI apparatus 100, or may display the image obtained from the MRI apparatus 100. The workstation 200 may include a manipulation unit 210 to receive a command from the user; and a display unit 220 to display a predetermined image for the user. The manipulation unit 210 may be designed for the user to input various commands or data. The manipulation unit 210 may include a keyboard, a button, a wheel, a trackball, a mouse, a touchpad, a touchscreen, or various sensors. The display unit 200 may display the acquired MR images. For example, the display unit 200 may be implemented by a cathode ray tube (CRT), a light emitting diode (LED), an organic light emitting diode (OLED), an active-matrix organic light emitting diode (AMOLED), a liquid crystal display (LCD), an electronic paper display device, or the like.

As is apparent from the above description, the switch matrix assembly and the magnetic resonance imaging (MRI) apparatus using the same according to the embodiments of the present invention can solve signal insertion loss caused by open-stub capacitance generated from a signal path located after each switch of a crossbar switch matrix in which several signal paths are formed to cross each other and a switch is located at an intersection point.

The switch matrix assembly and the magnetic resonance imaging (MRI) apparatus using the same according to the embodiments of the present invention can design a relatively small matrix even when input and output values of a crossbar switch matrix are increased, such that production costs of the switch matrix or the MRI apparatus can be greatly reduced.

The switch matrix assembly and the magnetic resonance imaging (MRI) apparatus using the same according to the embodiments of the present invention can directly transmit a high-frequency radio frequency (RF) signal without reducing the high-frequency RF signal to an intermediate frequency (IF) band, such that the entire system structure can be simplified and production costs thereof can be greatly reduced.

In addition, the switch matrix assembly and the magnetic resonance imaging (MRI) apparatus using the same according to the embodiments of the present invention can directly transmit a signal irrespective of a frequency band of an input RF signal, such that there is no need to change the frequency band of the input RF signal although the input RF signal is in a high-frequency band.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A switch matrix assembly, comprising:
    a free induction decay (FID) switch matrix having a first path through which a free induction decay (FID) electric signal is received and the electric signal is transmitted;
    a first switching unit configured to selectively and electrically one of interconnect a first input unit and a first end of the first path, and to open the first end of the first path; and
    a second switching unit configured to selectively and electrically one of interconnect a second input unit and a second end of the first path, and to open the second end of the first path,
    wherein the first switching unit is able to directly interconnect the first input unit and the first end of the first path, to open the first end of the first path, and to directly interconnect the first end of the first path to a first inductor, and is configured to selectively performs one of said actions.

2. The switch matrix assembly according to claim 1, wherein the first switching unit is configured to open the first end of the first path when the second switching unit electrically interconnects the second input unit and the second end of the first path.

3. The switch matrix assembly according to claim 1, further comprising:
    the first inductor connected to the first switching unit,
    wherein the first switching unit selectively connects the first end of the first path to the first inductor.

4. The switch matrix assembly according to claim 3, wherein:
    when the second switching unit electrically interconnects the second input unit and the second end of the first path, the first switching unit selectively one of opens the first end of the first path and connects the first end of the first path to the first inductor.

5. The switch matrix assembly according to claim 4, wherein:
at a time the second switching unit electrically interconnects the second input unit and the second end of the first path,
when a capacitance occurs due to an open-stub, the first switching unit connects the first end of the first path to the first inductor; and
when the capacitance does not occur due to the open-stub, the first switching unit opens the first end of the first path.

6. The switch matrix assembly according to claim 4, wherein the FID switch matrix further includes:
at least one second path arranged to cross the first path, and to include an output unit at one end thereof; and
at least one path switching unit disposed at an intersection of the first path and the second path, configured to electrically one of interconnect and disconnect the first path and the second path.

7. The switch matrix assembly according to claim 6, wherein:
at a time any one first path switching unit from among path switching units is located adjacent to the second switching unit, the first switching unit connects the first end of the first path to the first inductor.

8. The switch matrix assembly according to claim 6, wherein:
at a time any one first path switching unit from among path switching units is located adjacent to the first switching unit, the first switching unit opens the first end of the first path.

9. The switch matrix assembly according to claim 3, wherein:
the first inductor is among a plurality of inductors having different inductances; and
the first switching unit connects any one of the plurality of inductors to the first end of the first path.

10. The switch matrix assembly according to claim 9, wherein the first switching unit connects any one of the plurality of inductors to the first end of the first path according to an open-stub capacitance.

11. The switch matrix assembly according to claim 1, further comprising:
a first resistor connected to the first switching unit,
wherein the first switching unit further connects the first end of the first path to the first resistor.

12. The switch matrix assembly according to claim 11, wherein the first switching unit connects the first end of the first path to the first resistor when the electric signal applied to the first path is not used.

13. The switch matrix assembly according to claim 1, wherein:
the first switching unit includes a matrix connection unit connected to the first end of the first path, and an input unit connection unit and an opening unit which are connected to the first input unit,
wherein any one of the input unit connection unit and the opening unit is selectively connected to the matrix connection unit.

14. The switch matrix assembly according to claim 13, wherein:
the first switching unit further includes an inductor connection unit connected to the first inductor; and
any one of the input unit connection unit, the opening unit, and the first inductor connection unit is selectively connected to the matrix connection unit.

15. The switch matrix assembly according to claim 13, wherein:
the first switching unit further includes a plurality of inductor connection units respectively connected to a plurality of inductors; and
any one of the input unit connection unit, the opening unit, and the plurality of inductor connection units is selectively connected to the matrix connection unit.

16. The switch matrix assembly according to claim 13, wherein:
the first switching unit further includes a resistor connection unit connected to a first resistor; and
any one of the input unit connection unit, the opening unit, and the resistor connection unit is selectively connected to the matrix connection unit.

17. The switch matrix assembly according to claim 1, wherein:
the second switching unit opens the second end of the first path when the first switching unit electrically connects the first input unit to the first end of the first path.

18. The switch matrix assembly according to claim 3, further comprising:
a second inductor connected to the second switching unit, wherein the second switching unit further selectively connects the second end of the first path to the second inductor.

19. The switch matrix assembly according to claim 11, further comprising:
a second resistor connected to the second switching unit, wherein the second switching unit further connects the second end of the first path to the second resistor.

20. A switch matrix assembly, comprising:
a free induction decay (FID) electric signal matrix switching unit configured to receive at least one free induction decay (FID) electric signal from a first input unit and a second input unit;
a first switch matrix configured to include a first path to which the electric signal is applied;
a first switching unit configured to electrically one of interconnect and disconnect the matrix switching unit and a first end of the first path;
a second matrix switch configured to include a second path to which the electric signal is applied; and
a second switching unit configured to electrically one of interconnect the matrix switching unit and a first end of the second path and to open a second end of the second path,
wherein the matrix switching unit selectively one of interconnects the first input unit and the first switching unit and interconnects the second input unit and the first switching unit,
wherein the first switching unit is able to directly interconnect the first input unit and the first end of the first path, to open the first end of the first path, and to directly interconnect the first end of the first path to a first inductor, and is configured to selectively performs one of said actions.

* * * * *